United States Patent [19]

Kojima et al.

[11] Patent Number: 5,188,975

[45] Date of Patent: Feb. 23, 1993

[54] METHOD OF PRODUCING A CONNECTION HOLE FOR A DRAM HAVING AT LEAST THREE CONDUCTOR LAYERS IN A SELF ALIGNMENT MANNER.

[75] Inventors: Masayuki Kojima, Kokubunji; Shinji Nishihara, Tachikawa; Fumiyuki Kanai, Houya, all of Japan

[73] Assignee: Hitachi, Ltd., Tokyo, Japan

[21] Appl. No.: 885,852

[22] Filed: May 20, 1992

[30] Foreign Application Priority Data

May 20, 1991 [JP] Japan .................................. 3-114605

[51] Int. Cl.[5] .................... H01L 21/266; H01L 21/76
[52] U.S. Cl. ........................................ 437/48; 437/60; 437/982; 437/984
[58] Field of Search ...................... 437/47, 48, 49, 60, 437/195, 240, 919, 982, 984; 148/DIG. 14, DIG. 133

[56] References Cited

U.S. PATENT DOCUMENTS

| | | | |
|---|---|---|---|
| 5,071,781 | 12/1991 | Seo et al. | 437/60 |
| 5,110,766 | 5/1992 | Maeda et al. | 437/195 |
| 5,116,776 | 5/1992 | Chan et al. | 437/60 |
| 5,120,674 | 6/1992 | Chin et al. | 437/48 |

Primary Examiner—Brian E. Hearn
Assistant Examiner—C. Chaudhari
Attorney, Agent, or Firm—Antonelli, Terry, Stout & Kraus

[57] ABSTRACT

In a semiconductor integrated circuit device having at least three conductor layers, a connection hole for the lower conductor layer and the upper conductor layer can be formed in self-alignment to the intermediate conductor layer after flattening the underlying insulation film for the upper conductor layer and deterioration of the insulation withstand voltage between the upper conductor layer and the intermediate conductor layer can be prevented.

15 Claims, 12 Drawing Sheets

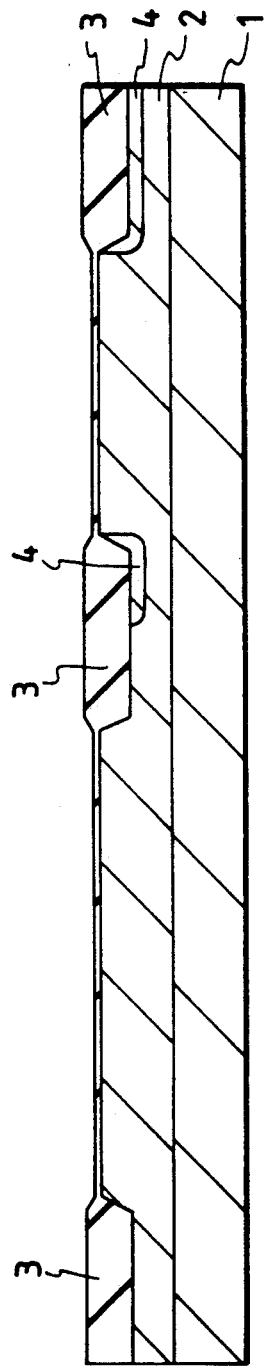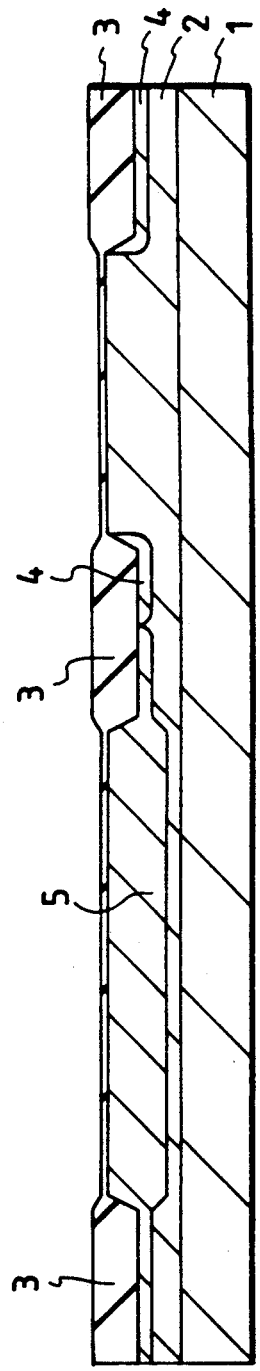

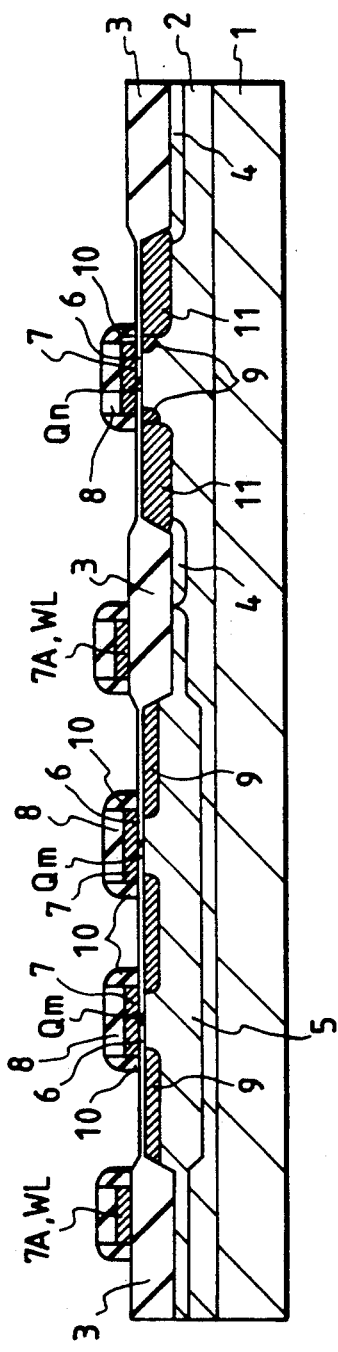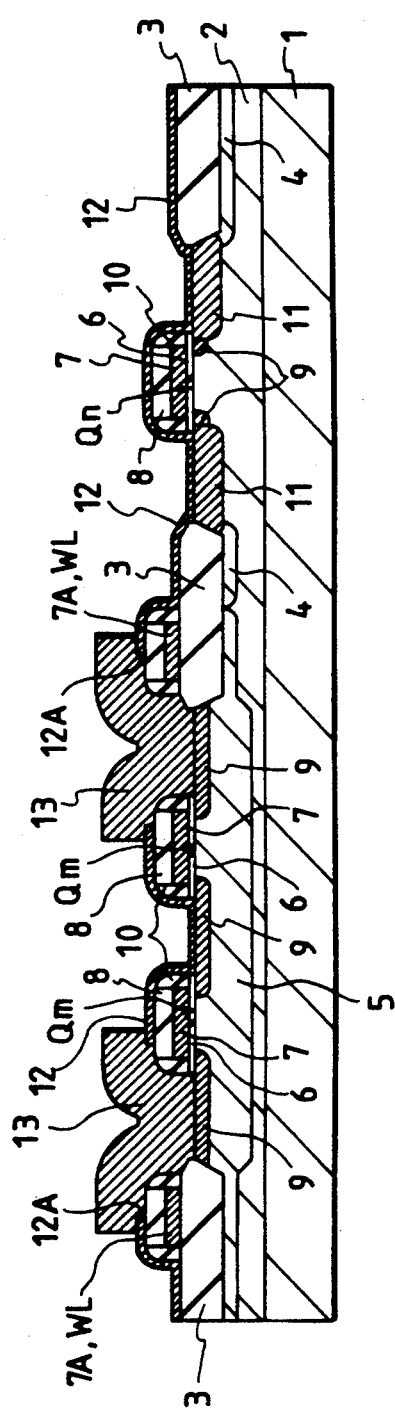

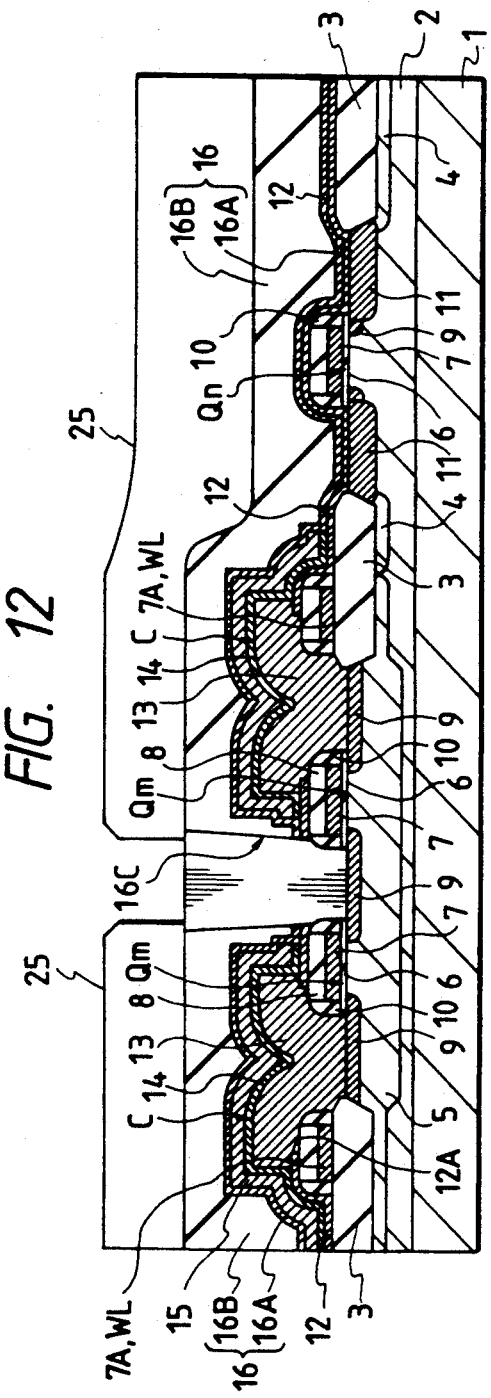
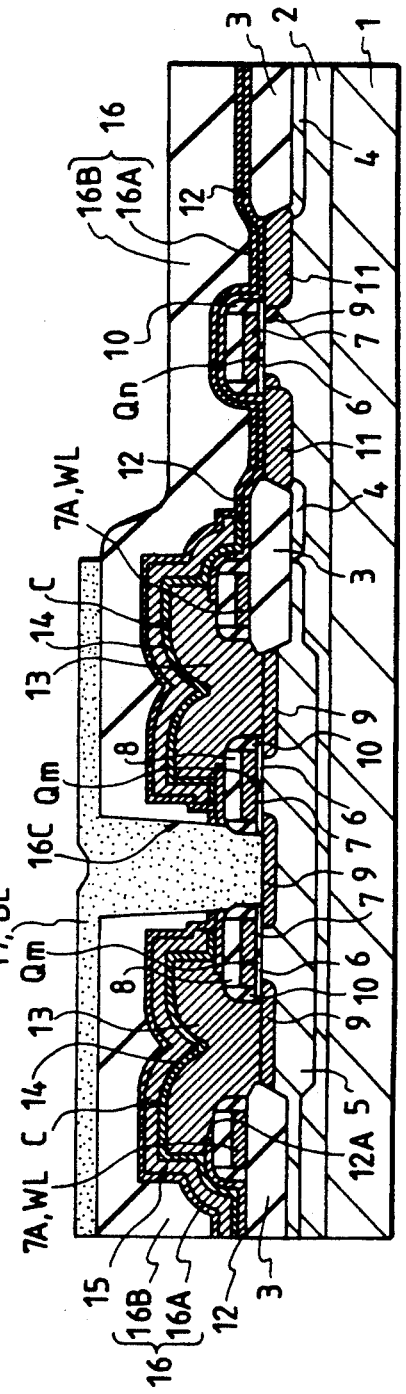

METHOD OF PRODUCING A CONNECTION HOLE FOR A DRAM HAVING AT LEAST THREE CONDUCTOR LAYERS IN A SELF ALIGNMENT MANNER.

BACKGROUND OF THE INVENTION

The present invention concerns a wiring technique and, more in particular, it relates to an effective technique for applying a wiring technique to connection between a lower conductor layer and an upper conductor layer in a semiconductor integrated circuit device.

DRAM (Dynamic Random Access Memory) as a semiconductor memory device disclosed in U.S. Ser. No. 07/496,537 previously filed by the present applicant on Mar. 20, 1990 has a large capacity of 4M bit. A plurality of memory cells each for storing 1 bit information of the DRAM are arranged each at an intersection between a complementary data line and a word line and constituted with a serial circuit of an n-channel MOSFET for the selection of memory cell and a capacitance device for information storage.

The memory cell selecting n-channel MOSFET comprises a pair of n-type semiconductor regions used as source and drain regions, a gate insulation film, a gate electrode and a channel forming region. One of the n-type semiconductor regions is connected with the complementary data line. The gate electrode is integrally constituted along the direction of the width of the gate with the word line and connected electrically. The gate electrode and the word line are formed in the step of forming a first conductive layer in DRAM manufacturing process and it is formed, for example, with a polycrystalline silicone film. The other of the n-type semiconductor regions is connected to one of the electrodes of the information storage capacitance device.

The information storage capacitance device is constituted as a so-called stacked capacitor structure (STC structure) in which a lower layer electrode (one electrode), a dielectric film, an upper layer electrode (the other electrode) are respectively stacked successively. The lower layer electrode is connected to the other of the n-type semiconductor regions of the memory cell selecting n-channel MOSFET, and a peripheral portion thereof is extended on the gate electrode and on a word line connected to other adjacent memory cell. The lower layer electrode is formed in the step of forming a second conductive layer in the DRAM manufacturing process and is formed, for example, with a polycrystalline silicon film. The dielectric film is formed to the upper surface and the side of the lower layer electrode. The upper layer electrode is formed by way of the dielectric film on the lower layer electrode, constituted integrally with the upper layer electrode of the information storage capacitance device of other adjacent memory cells and connected electrically. That is, the upper layer electrode is used as a plate electrode in common with information storage capacitance devices of a plurality of memory cells. The upper electrode is formed in the step of forming a third conductive layer in the DRAM manufacturing process and is formed, for example, with a polycrystalline silicon film.

The information storage capacitance device adopting the stacked structure utilizes the upper surface and the side of the lower layer electrode as a charge accumulation region. In addition, since the charge accumulation region can be increased along the direction of the height by utilizing a step corresponding to the film thickness of each of the word lines, the charge accumulation amount of the charge accumulation capacitance device can be increased as a whole. That is, the information storage capacitance device of this type can reduce the generation of α-ray soft error or can improve the degree of integration by the area reduction of the memory cell.

The complementary data line is formed on an interlayer insulation layer formed on the entire area of a semiconductor substrate including that on the upper layer electrode of the information storage capacitance device of the memory cell, and connected with the memory cell through a connection hole formed in the interlayer insulation film. The interlayer insulation film is formed with a BPSG film (or PSG film) and reflow is applied to the BPSG film to flatten the surface of the film.

Since the use of the BPSG film applied with glass flow can moderate the step in the interlayer insulation film, it can prevent disconnection failure of the complementary data line.

Further, the complementary data line is formed by using an etching mask (photoresist mask) formed by photolithography and applying etching to a previously formed wiring material. Since the use of the BPSG film and the reflow technique can flatten the surface of the interlayer insulation film and moderate the stepped configuration in the region in which the wiring material is removed by etching, it can prevent an undesired phenomenon that the wiring material is not removed in this region. That is, use of the BPSG film applied with reflow can improve the patterning accuracy of the complementary data line.

BRIEF DESCRIPTION OF THE DRAWINGS

FIGS. 6 to 15 are cross sectional views illustrating production steps for a memory cell and NMOS constituting peripheral circuits;

SUMMARY OF THE INVENTION

Figure 1:
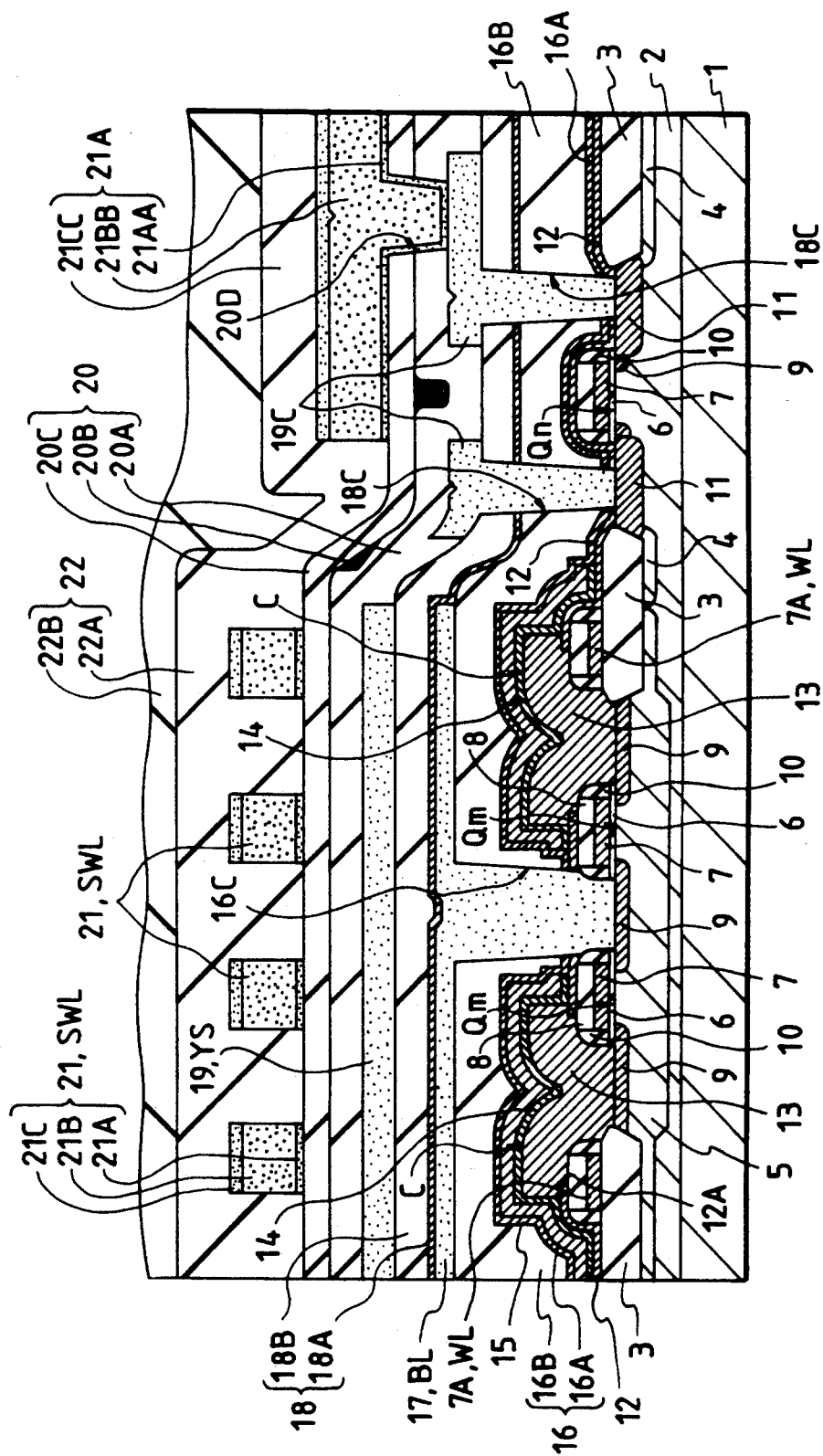
FIG. 1 is a cross sectional view for a portion of a DRAM in Embodiment 1 of the present invention.

Prior to the development of DRAM in the next generation having a large capacity of 16 Mbit or greater, the present inventor has found the following problems.

In a DRAM having a large capacity of 16 Mbit or greater, a ratio of an area for a connection region between one of n-type semiconductor regions of a memory cell selecting n-channel MOSFET and a complementary data line is increased relative to the area for the entire memory cell. The area for the connection region is the sum of the following areas. Area corresponding to an area of an opening area for a connection hole formed in an interlayer insulation film restricted by a minimum fabrication size in the DRAM production process (minimum resolution power of a photoresist film in photolithography). An area for isolating a gate electrode of a memory cell selecting n-channel MOSFET and a complementary data line in the connection hole for ensuring insulation withstand voltage between them. An area corresponding to a dimensional margin for mask alignment in the production process between the gate electrode and the connection hole (or the complementary data line in the connection hole). Accordingly, since the area occupied by the memory cell is increased being restricted by the area occupied by the connection region, the degree of integration of DRAM is lowered and, as a result, DRAM can not be provided with a large capacity.

For overcoming the technical problem, it is considered necessary to adopt a self align contact technique of forming a connection hole that connects a data line of a memory cell with one of n-type semiconductor regions in a memory cell selecting MOSFET in self alignment relative to a word line.

At present, a LDD (lightly Doped Drain) structure has been adopted for a memory cell selecting n-channel MOSFET with an aim for preventing a short channel effect and taking a countermeasure for hot carriers or the like. In the LDD structure, a side wall insulation film formed in self alignment manner to the gate electrode, that is, a side wall spacer is formed on the side wall of the gate electrode. In the gate electrode, the side wall is covered with the side wall spacer while the upper surface is covered with other insulation film, so that the upper surface and the side of the gate electrode are completely covered with the insulation film.

However, when a BPSG film is used as an underlying interlayer insulation film to the complementary data line and reflow is applied to the BPSG film for flattening, the thickness of the interlayer insulation film is increased on the connection region (one of n-type semiconductor regions) as compared with that on the gate electrode of the memory cell selecting n-channel MOSFET. That is, when a connection hole is formed in the interlayer insulation film applied with reflow, so as to expose the gate electrode or the side wall spacer and the n-type semiconductor region for connecting the data line and the memory cell selecting n-channel MOSFET, the side wall spacer on the side wall of the gate electrode is also etched. Therefore, the insulation withstand voltage between the gate electrode and the complementary data line is deteriorated at the upper corner of the gate electrode and, in an worst case, they are short circuited to each other.

An object of the present invention is to provide, in a semiconductor integrated circuit device having at least three levels conductor layers, a technique capable of forming a connection hole for an upper conductor layer and a lower conductor layer in self alignment manner to an intermediate conductor layer after flattening an underlying insulation film of the upper conductor layer and capable of preventing the deterioration of the insulation withstand voltage between the upper conductor layer and the intermediate conductor layer.

Another object of the present invention is to provide in a semiconductor integrated circuit device for connecting a wiring to one of semiconductor regions of MISFET, a technique capable of improving the insulation withstand voltage between the gate electrode of the MISFET and the wiring, flattening the surface of the underlying insulation layer of the wiring and forming a connection region between one of the semiconductor regions and the wiring in self alignment manner relative to the gate electrode of MISFET.

A further object of the present invention is to provide a technique capable of reducing the number of manufacturing steps in the production process of the semiconductor integrated circuit device.

These and other objects, as well as novel features of the present invention will become apparent by reading the following descriptions in the present specification and the appended drawings.

DESCRIPTION OF THE PREFERRED EMBODIMENTS

Description will now be made to the constitution of the present invention in conjunction with preferred embodiments in which the present invention is applied to a large capacity DRAM using, as a memory cell, a serial circuit of a memory cell selecting MISFET and an information storage capacitance device adopting a stacked structure.

Throughout the drawings for explaining preferred embodiments, those portions having identical functions carry the same reference numerals, for which duplicate explanations are omitted.

EMBODIMENT

Figure 2:
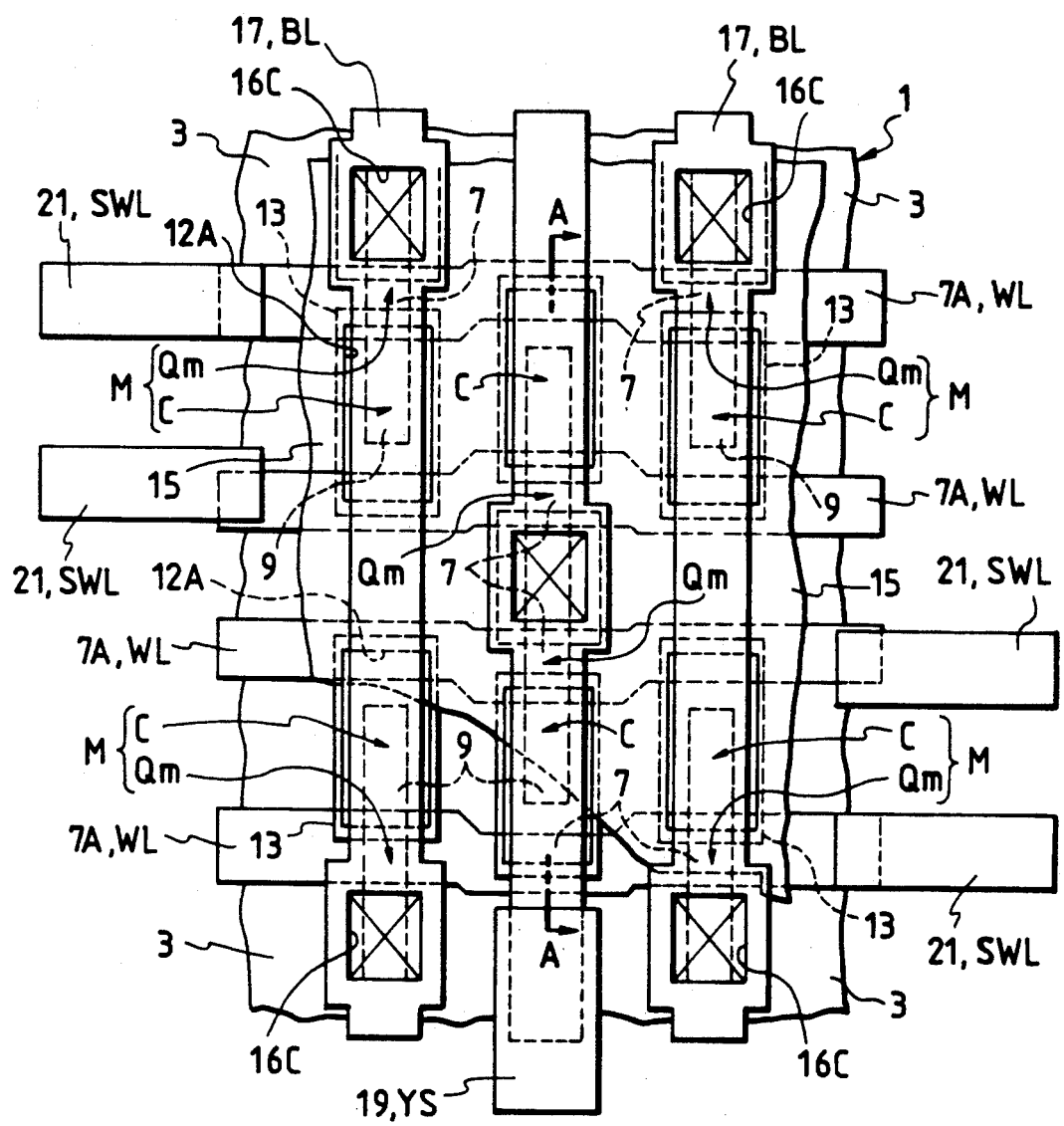
FIG. 2 is a plan view for a memory cell portion of the DRAM.

The constitution of a DRAM as Example 1 according to the present invention is shown in FIG. 1 (cross sectional view for a portion) and FIG. 2 (a plan view for a portion of a memory cell array). In FIG. 1, a portion of memory cell array is shown on the left, while one of n-channel MISFET of a complementary MISFET constituting a direct peripheral circuit or an indirect peripheral circuit is shown on the right.

As shown in FIGS. 1 and 2, DRAM is mainly constituted with a p-type semiconductor substrate 1 comprising single crystal silicon. A memory cell M of DRAM for storing 1 bit information is constituted with a serial circuit of a memory cell selecting MISFET Qm and an information storage capacitance device C.

Figure 3:
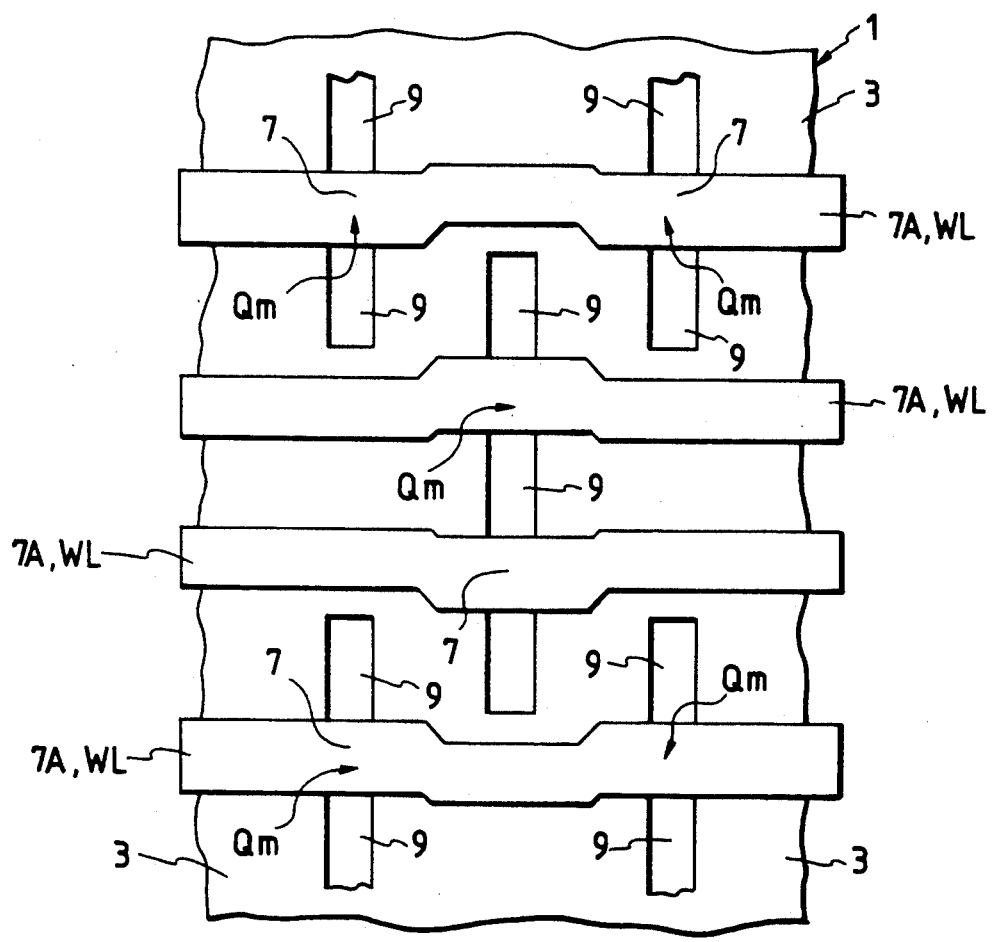
FIGS. 3 to 5 are plan views for the memory cell portion in predetermined steps.

As shown in FIGS. 1, 2 and 3 (a plan view for a portion in predetermined production steps), the memory cell selecting n-channel MISFET Qm is constituted on a main surface of a p-type semiconductor region 5 within an active region defined and surrounded at the periphery thereof with a device isolation region. That is, the memory cell selecting n-channel MISFET Qm is mainly constituted with a channel forming region (p-type semiconductor region 5), a gate insulation film 6, gate electrode 7 and a pair of n-type semiconductor regions 9 used as a source region and a drain region.

The device isolation region is mainly constituted with a device isolation insolation film (field insulation film) 3 and a p-type semiconductor region (corresponding to p-type channel stopper region) 5 below the device isolation insulation film 3.

Each of the p-type semiconductor region 5 used as the device isolation region and the p-type semiconductor region 5 used as the channel-forming region for the memory cell selecting n-channel MISFET Qm is formed on a main surface of a p-type well region 2 formed to a main surface of the p-type semiconductor substrate 1. The p-type semiconductor region 5 constitutes a potential barrier to minority carriers generated by α-rays incident to either of the p-well region 2 or the p-type semiconductor substrate 1, particularly, in a region in which the memory cell M is disposed.

Although not illustrated in each of FIGS. 1 to 3, each of direct peripheral circuits such as a driver circuit, a decoder circuit and a sense amplifier circuit and indirect peripheral circuits such as a clock signal system circuit and an address buffer system circuit of DRAM is constituted with a complementary type MISFET. An n-type well region is constituted in a region for forming the p-channel MISFET of the complementary MISFET.

The gate insulation film 6 of the memory cell selecting n-channel MISFET Qm is formed with a silicon oxide film obtained by oxidizing the main surface of the p-type semiconductor region 5 by means of thermal oxidation.

The gate electrode 7 is formed in the step of forming the first level of conductor layer in the manufacturing process and formed, for example, with a polycrystalline silicon film. The polycrystalline silicon film is deposited by a CVD process to which an impurity, for example, n-type impurity is introduced for reducing the resistance value during or after the deposition. Since at least three levels of conductor layers are used in the memory cell M and the stepped configuration is increased, the gate electrode 7 is formed with a thin film thickness of about 100 to 200 nm, and integrally constituted with a word line (WL) 7a in the direction of the gate width thereof and connected electrically (that is, formed with the same conductor layer).

Further, the gate electrode 7 may be formed with a single layer film of a refractory metal film or a refractory metal silicide film, or as a stacked film prepared by stacking either a refractory metal film or a refractory metal silicide film on a polycrystalline silicon film, with an aim of increasing the operation speed of the memory selecting n-channel MISFET Qm.

An insulation film 8 is formed on the upper surface and an insulative side wall spacer (side wall insulation film) 10 is formed on the side (side wall), respectively, of the gate electrode 7 and, in the same manner, the insulation film 8 and the side wall spacer 10 are respectively formed to the word line 7A. Each of the insulation film 8 and the side wall spacer 10 is formed as an insulation film for covering the surface of a portion of the gate electrode 7 or a portion of the word line 7A. Both of the insulation film 8 and the side wall spacer 10 constitute insulation films for covering the entire surface (upper surface and the side) of the gate electrode 7 or the entire surface of the word line 7A. The insulation film 8 is formed in an identical pattern with that for the word line 7A by a mask for forming the word line 7A, while the side wall spacer 10 is formed in self alignment to the gate electrode 7 or the word line 7A.

Each of the insulation film 8 and the side wall spacer 10 has a dense and satisfactory film quality and is formed with a silicon oxide film deposited by a CVD process mainly for improving the insulation withstand voltage. The silicon oxide film is deposited, for example, by a vacuum CVD process using an inorganic silane (monosilane: $SiH_4$) as a main component of a source gas and set to a high temperature of about 800°–840° C. and a pressure of about 0.5–1.0 Torr, respectively. The insulation film 8 is formed, for example, to a thickness of about 250 to 350 nm. The side wall spacer 10 is set to a thickness, for example, of about 150 to 250 nm in a most thick region from the side of the gate electrode 7 to the direction perpendicular thereto.

The n-type semiconductor region 9 used as the source region or the drain region is formed on the main surface of the p-type semiconductor region to the side of the gate electrode 7 in self alignment relative to the gate electrode 7. The n-type semiconductor region 9 is formed in the same production step as that as that for the n-type semiconductor region 9 at low impurity concentration, in the source region or the drain region, of the n-channel MISFET Qn of a complementary MISFET for each of direct peripheral circuits and indirect peripheral circuits to be described later (corresponding to the same conductor layer). An LDD structure is used for the n-channel MISFET Qn and the n-type semiconductor region 9 at low impurity concentration is used as the LDD portion for the n-channel MISFET Qn. Accordingly, since the memory cell selecting n-channel MISFET Qm is constituted at least with the drain region in the n-type semiconductor region 9 at low impurity concentration, it is substantially in the LDD structure.

A region corresponding to an $n^+$-type semiconductor region 11 at high impurity concentration in the source region or the drain region of the n-channel MISFET Qn for each of the direct peripheral circuits and the indirect peripheral circuits is constituted neither in the source resin nor in the drain region of the memory sell selecting n-channel MISFET Qm. As described later in the production process, the $n^+$-type semiconductor region 11 is formed by using an ion implantation process and introducing an n-type impurity at a high impurity concentration. A heat treatment is applied after the introduction of the n-type impurity. Since crystal defects caused by the introduction of the n-type impurity near the pn junction for each of the source region and the drain region can not be recovered sufficiently by the heat treatment described above, an $n^+$-type semiconductor region 11 at high impurity concentration is not constituted to the memory cell selecting n-channel MISFET Qm. Occurrence of the crystal defects induces leakage of information (charge) stored in the memory cell M. Since the information leak increases the number of rewriting operation (refreshing operation) in DRAM and, since neither the information writing operation nor the information reading operation can be actuated during the rewriting operation, the operation speed is lowered as a result.

Although not illustrated in FIG. 1, the source region or the drain region of the memory cell selecting n-channel MISFET Qm has an n-type impurity diffused from the lower layer electrode 13 of the information storage capacitance device C and is constituted with the n-type semiconductor region 9 at low impurity concentration and the $n^+$-type semiconductor region at high diffused impurity concentration.

The n-type semiconductor region 9 is formed, for example, by using ion implantation and introducing P at an impurity concentration of about $10^{13}$ to $10^{14}$ atoms/cm$^2$ at an energy level of about 30 to 50 Kev. Upon introducing P that forms the n-type semiconductor region 9, each of the resist film for patterning the gate electrode 7 and the insulation film 8 stacked on the upper surface thereof and the device isolation insulation film 3 is used as an impurity introduction mask.

As shown in FIGS. 1, 2, 4 and 5 (a plan view for a portion in predetermined production steps), the information storage capacitance device C is constituted, above the memory selecting n-channel MISFET Qm, in a so-called stacked structure in which a lower layer electrode 13, a dielectric film 14 and an upper layer electrode 15 are successively stacked, respectively.

Figure 4:
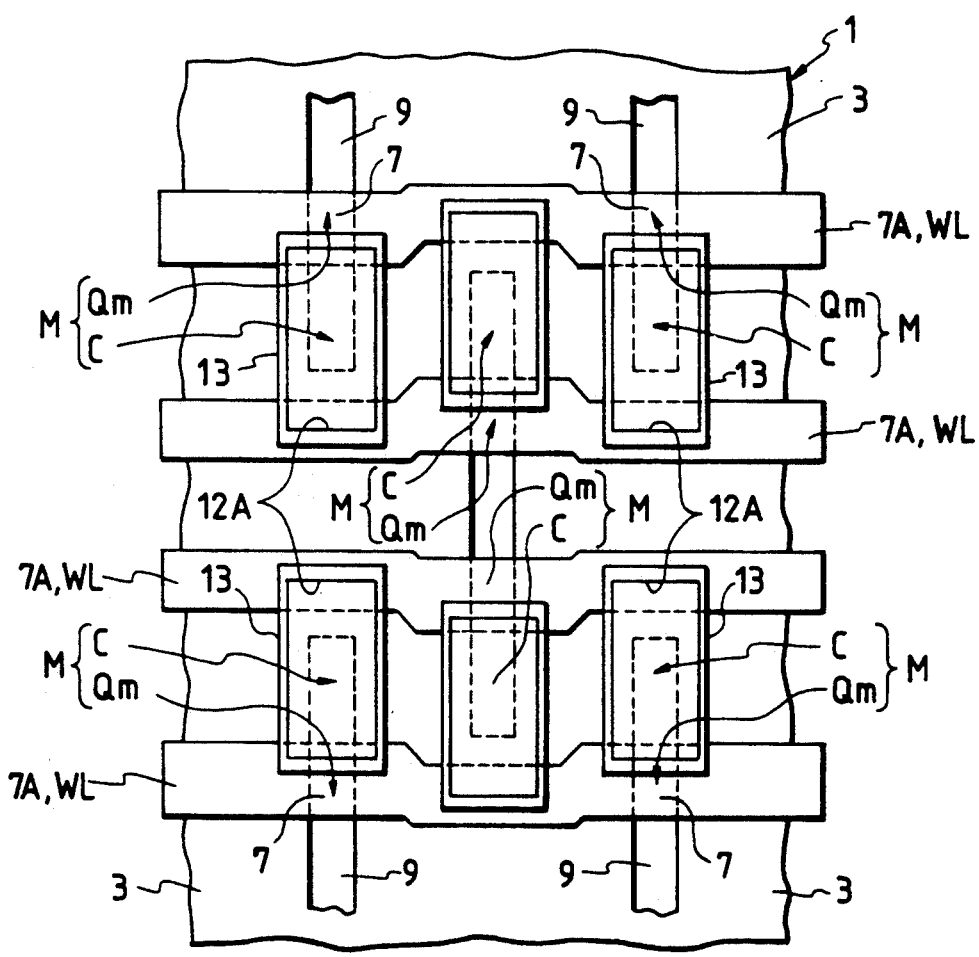

As shown, particularly, in FIGS. 1 and 4, the lower layer electrode 13 is electrically connected at the central portion thereof with the other of the n-type semiconductor regions 9 of the memory cell selecting n-channel MISFET Qm, while the peripheral portion thereof is extended on the gate electrode 7 of the memory cell selecting n-channel MISFET Qm and on other word line 7A which is in adjacent to and extended to the word line 7A connected to the gate electrode 7. The lower layer electrode 13 is connected with the other of the n-type semiconductor regions 9 in the region defined between the gate electrode 7 and other word line 7A through a connection hole formed in the interlayer insulation film 12.

A portion between the lower electrode 13 and the gate electrode 7 is insulated by way of the insulation film 8 and the side wall spacer 10 covering at least the surface of the gate electrode 7. The lower electrode 13 is connected with the other of n-type semiconductor regions 9 in self alignment relative to the gate electrode 7 along the surface of the insulation film 8 and the side wall spacer 10. In the same manner, the lower layer electrode 13 is insulated from the word line 7A and formed in self-alignment to the word line 7A.

The lower layer electrode 13 is formed in the step of forming a second level of conductive layer in the production process and formed, for example, with a polycrystalline silicon film. The polycrystalline silicon film is deposited by a CVD process and introduced with an impurity for reducing the resistance value, for example, an n-type impurity during or after the deposition. The lower layer electrode 13 is formed with a large film thickness, for example, of greater than 400 nm with an aim of forming a charge accumulation region at the periphery of the side thereof and increasing the accumulation amount of charges. Further, the lower layer electrode 13 is formed with a film thickness, for example, of about 600 nm which corresponds to a size smaller than about ½ of space between the gate electrode 7 and other word line 7A with an aim of forming a stepped configuration corresponding to the film thickness for the sum of the gate electrode 7 and the insulation film 8 and the film thickness for the sum of the word line 7A and the insulation film 8 at a central portion and increasing the accumulation amount of charges along the direction of the height by utilizing the stepped configuration. That is, the lower layer electrode 13 is formed to a film thickness of about 200 to 600 nm.

The lower layer electrode 13 corresponds to a storage node region for accumulating information stored in the memory cell M, is disposed on every memory cell and formed independent of other adjacent memory cells M.

The dielectric film 14 is formed at least along the upper surface and the side of the lower layer electrode 13. The dielectric film 14 is constituted as a 3-layered structure in which each of a silicon oxide film silicon nitride film or silicon oxide film is stacked successively. For the silicon oxide film as the lower layer, a spontaneously oxidized silicon film formed on the surface of the lower layer electrode (polycrystalline silicon film) 13 is used. The silicon nitride as film as the intermediate layer has a higher dielectric constant as comparted with that of the silicon oxide film, is formed mainly for increasing the amount of accumulated charges as information and is deposited, for example, by a CVD or sputter process. The silicon oxide film as the upper layer is formed mainly for embedding pin holes in the silicon nitride film the intermediate layer and improving the insulation withstand voltage of the entire insulation film 14 and is formed by oxidizing the surface of the silicon nitride film as the intermediate layer by means of steam oxidation.

Further, the dielectric film 14 is not restricted only to the foregoing structure but it may be formed as a single layer of any one of the films having a high dielectric constant such as a silicon oxide film, a silicon nitride film or the like, or as a composite layer comprising them.

Figure 5:
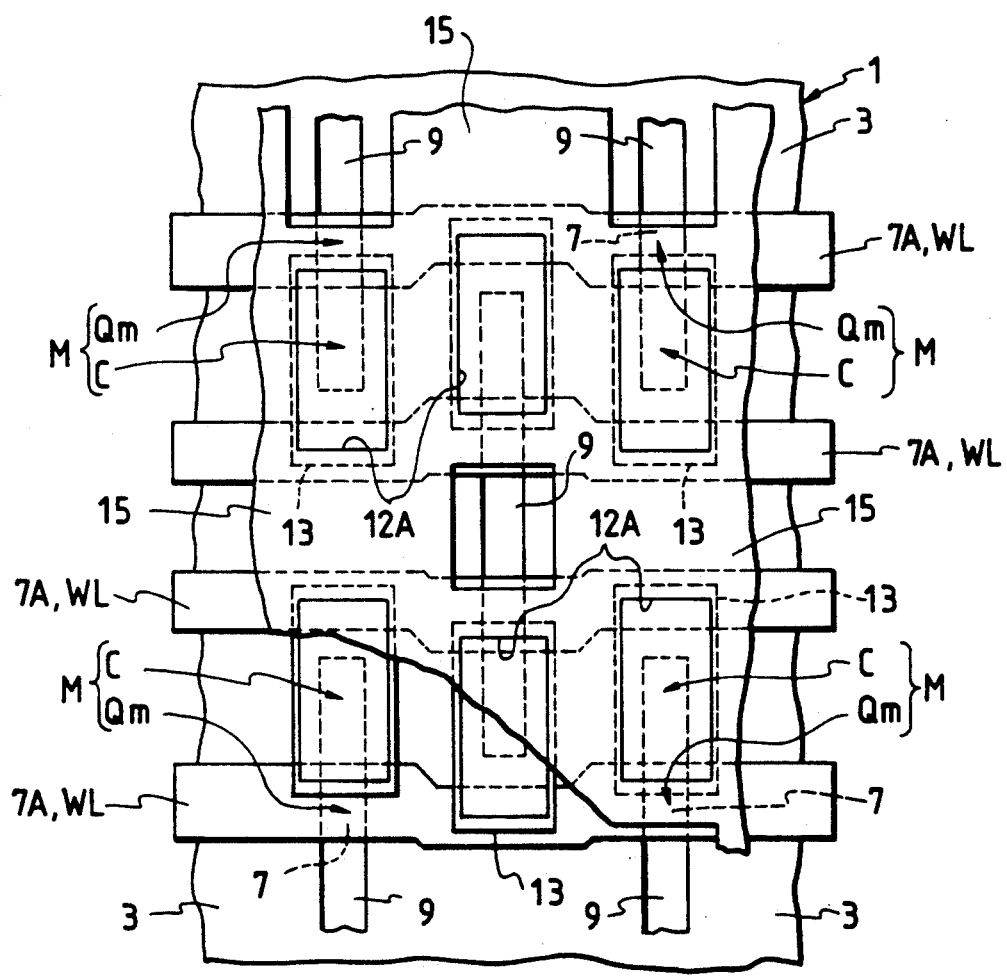

The upper layer electrode 15 is formed, particularly, as shown in FIGS. 1 and 5, on the upper surface and the side of the lower layer electrode 13 by way of the dielectric film 14. The upper layer electrode 15 is constituted integrally with the upper layer electrode 15 of the information storage capacitance device C of the memory cell M and the information storage capacitance device of other memory cell disposed in adjacent to the periphery thereof and connected electrically to be constituted as a plate electrode in common with a plurality of memory cells M arranged in a memory cell array.

In this embodiment, since a ½ Vcc pre-charge systems is adopted to the information writing and reading operations in DRAM in this example, an intermediate potential of about 2.5 V between an operation voltage of a circuit mounted on DRAM, for example, 5 V and a reference voltage of the circuit, for example, 0 V is supplied to the upper layer electrode 15. Further, a voltage-reducing power source circuit is mounted to DRAM and if an operation voltage of 3 V or 3.3 V is used for the internal circuits by the voltage reducing power source circuit, about 1.5 V or about 1.65 V is supplied to the upper layer electrode 15.

The upper layer electrode 15 is formed in the step of forming a third level of conductor layer in the production process and is formed, for example, with a polycrystalline silicon film. The polycrystalline silicon film is deposited by a CVD process and an impurity for reducing the resistance value, for example, the n-type impurity is introduced during or after the deposition. Since at least three levels of conductor layers are used for the memory cell M and the stepped configuration is increased, the upper layer electrode 15 is formed with such a thin film thickness as about 100 to 180 nm.

As shown in FIGS. 1 and 2, in the memory cell constituted as described above, a complementary bit line (BL) 17 is electrically connected with one of the n-type semiconductor regions 9 of the memory cell selecting n-channel MISFET Qm. The complementary bit line 17 extends on the surface of the interlayer insulation film 16, and is connected with one of the n-type semiconductor regions 9 through a connection hole (bit line contact hole) 16C formed through the interlayer insulation film 16.

The complementary bit line 17 comprises two bit lines 17 as a pair disposed in adjacent with the extending direction of the word line 7 and two sets of complementary bit lines 17 disposed in the extending direction of the word line 7 constitute a unit block.

The interlayer insulation film 16 comprises a silicon oxide film 16A and a BPSG film 16B stacked thereover.

The silicon oxide film 16A as the lower layer is formed mainly for preventing B and P added to the BPSG film 16B as the upper layer from leaking the semiconductor devices. The silicon oxide film 16A is deposited, for example, by an atmospheric CVD process using, an organic silane (for example, organosilane: $Si(OR)_4$, in which R represents an alkyl group) as a main component of a source gas and set to a low temperature of about 700° to 780° C. and a pressure of about 1 Torr, respectively. The silicon oxide film 16A as the lower layer is formed to a film thickness, for example, of about 80 to 150 nm.

The BPSG film 16B of the upper layer is flattened at the surface by reflow to moderate the unevenness in the insulation film under the complementary bit line 17 or the wiring as the upper layer thereof. Further, reflow applied to the BPSG film 16B as the upper layer aims for preventing short circuit between adjacent complementary bit lines 17 caused upon patterning the complementary bit line 17. The BPSG film 16B is deposited, for example, by an atmospheric CVD process using $SiH_4$ as a main component of a source gas and $PH_3$ and as an additive and set to a low temperature of about 420° to 480° C. and a pressure of about 1 Torr, respectively. The BPSG film 16B as the upper layer is formed to a large film thickness, for example, of about 500 to 900 nm.

The BPSG film 16B as the upper layer is applied with reflow with an aim of flattening the surface. The concentration of P added to the BPSG film 16B mainly for the reflow is set, for example, to about 5 to 7 mol %, while the concentration of B added to the BPSG film 16B mainly for applying the reflow at a low temperature is set, for example, to about 12 to 14 mol %. Reflow is applied to the BPSG film 16B at a low temperature of about 850° to 950° C.

In a case of applying etching by using an etching gas mixture mainly comprising fluoro compounds, for example, $CF_4$ and $CHF_3$, for the BPSG film 16B as the upper layer of the interlayer insulation film 16, an etching selection ratio is obtained to each of the insulation film 8 formed on the upper surface of the gate electrode 7 of the memory selecting n-channel MISFET Qm or on the upper surface of the word line 7 and the side wall spacer 10 formed on the side of the gate electrode 7 of the memory cell selecting n-channel MISFET Qm. Since the bonding energy between a silicon atom and an oxygen atom is small and a fluorine radical formed by the etching gas and the silicon atom can be bonded easily, etching proceeds rapidly for the BPSG film 16B. On the other hand, the bonding energy between the silicon atom and the oxygen atom is large and etching proceeds by driving out them physically in each of the insulation film 8 and the side wall spacer 10. Accordingly, in a case of using the etching gas containing the fluoro compounds described above, the etching rate for the BPSG film 16B can be made higher than that for each of the insulation film 8 and the side wall spacer 10 although they are silicon oxide film of the same type. In this example, the etching rate for the BPSG film 16B can be increased by about 2-3 times as compared with that for each of the insulation film 8 and the side wall spacer 10.

The connection hole 16C is opened above one of the n-type semiconductor regions 9 and the side wall spacer 10 formed on the side of the gate electrode 7 of the memory cell selecting n-channel MISFET Qm of the memory cell M, and a complementary bit line 17 is connected to one of the n-type semiconductor regions 9 in self-alignment also to the gate electrode 7 and the word line 7A. In other words, the connection hole 16C is formed being aligned on the side wall spacer 10 formed on the side of the gate electrode 7 of the memory cell selecting n-channel MISFET Qm.

The connection hole 16C is formed, in this embodiment, by means of anisotropic etching using an etching mask formed by photolithography (refer to FIG. 12 or FIG. 16 to be described later) and using an etching gas containing the fluoro compound described above in this example. Accordingly, the lower side of the connection hole 16C as a connection portion for one of the n-type semiconductor regions 9 and the complementary bit line 17 is formed in self alignment to the gate electrode 7. The lower side of the connection hole 16C (connection portion between one of the n-type semiconductor regions 9 and the complementary bit line 17) is defined for the position of the inner wall of the connection hole 16C mainly with the side wall spacer 10, and insulative isolation is applied between each of the gate electrode 7 and the word line 7A and the complementary bit line 17 by way of the side wall spacer 10.

Since the connection hole 16C formed in self alignment to each of the gate electrode 7 and the word line 7A can basically save the dimensional margin for the mask alignment in the production process and reduce the area occupied by the connection region between the memory cell M and the complementary bit line 17 by so much as the dimensional margin for the mask alignment, the area occupied by the memory cell can be reduced.

The complementary bit line 17 is formed in the step of forming a fourth level of conductor layer in the production process, for example, with a stacked film comprising a polycrystalline silicon film and a refractory metal silicide film stacked thereover. The polycrystalline silicon film as the lower layer is formed mainly for the improvement of step coverage in the region of the stepped configuration such as a portion of the connection hole 16C of the refractory metal silicide film as the upper layer and it is deposited, for example, by a CVD process. An impurity for reducing the resistance value, for example, an n-type impurities is introduced during or after the deposition. The polycrystalline silicon film of the lower layer is formed to a film thickness, for example, of about 80 to 120 nm. The refractory metal silicide film as the upper layer is formed mainly for reducing the resistance value of the complementary bit line 17 and increasing the speed of the information writing and reading operation. The refractory metal silicide film as the upper layer is formed to a thickness of about 120 to 180 nm, for example, by using a $WSi_2$ film deposited by a sputtering or CVD process.

A column select line (YS) 19 is formed on the complementary bit line 17 by way of an interlayer insulation film 18.

The interlayer insulation film 18 comprises substantially the same structure as that of the interlayer insulation film 16 as the under layer for the complementary bit line 17, which comprises a silicon oxide film 18A as the lower layer and a BPSG film 18B stacked thereover.

The silicon oxide film 18A as the lower layer is, for example, in the same manner as that of the silicon oxide film 16A as the lower layer for the interlayer insulation film 16, for example, by an atmospheric CVD process using $Si(OR)_4$ as the main component of a source gas and formed to a film thickness of about 80 to 150 nm.

The BPSG film 18B as the upper layer is formed with an aim of flattening the surface and deposited substantially in the same manner as the BPSG film 16B as the upper layer described above, for example, by an atmospheric CVD process using $SiH_4$ as the main component of a source gas and $PH_3$ and $B_2H_6$ as the additive. Since the surface of the BPSG film 16B as the upper layer for the interlayer insulation film 16 as the lower layer is previously flattened and the surface of the BPSG film 18B as the upper layer can be flattened easily, the BPSG film 18B as the upper layer is formed to a somewhat thin film thickness, for example, of about 400 to 600 nm. The concentration of P is set, for example, to about 5-7 mol %, while the concentration of B is set, for example, to about 12-14 mol % in the BPSG film 18B as the upper layer. Reflow is applied to the BPSG film 18B at a low temperature of about 800° to 900° C.

The column select line 19 is formed in the step for forming a fifth level of conductor layer in the production process and formed, for example, with a stacked film of a refractory metal film. The refractory metal film as the lower layer is formed, for example, with a W film deposited by sputtering mainly for improving the adhesion between each of the interlayer insulation film 18 and the refractory metal film of the upper layer. The W film deposited by sputtering is formed to a relatively thin film thickness, for example, of about 150 to 250 nm in a region of a stepped configuration formed with a connection hole (18C) formed in the interlayer insulation film 18, with an aim for preventing the deterioration of the step coverage of the refractory metal film of the upper layer caused by an overhang configuration. The refractory metal film as the upper layer is formed with the same kind of the W film as that for the refractory metal layer of the lower layer and deposited by means of a CVD process mainly for improving the step coverage. The refractory metal film as the upper layer is formed to a film thickness, for example, of about 200 to 300 nm.

The column select line 19 is disposed at a rate of one line per one unit block described above, that is, four bit lines 17 in total in one unit block.

Shunt word lines (SWL) 21 are formed above the column select line 19 by way of an interlayer insulation film 20.

The interlayer insulation film 20 comprises a 3-layered structure in which a silicon oxide film 20A as a lower layer, a silicon oxide film 20B as an intermediate layer and a silicon oxide film 20C as an upper layer are successively stacked respectively.

For the silicon oxide film 20A as the lower layer, a film having a dense and satisfactory film quality deposited, for example, by a plasma CVD process using tetraethoxysilane (TEOS) gas (organic silane) as a main component of a source gas is used. The silicon oxide film 20A as the lower layer is formed to a film thickness, for example, of about 400 to 600 nm.

For the silicon oxide film 20B as the intermediate layer, a film coated by a SOG method (Spin On Glass), that is, a rotational coating method and cured by a baking treatment mainly for flattening the surface of the interlayer insulation film 20 is used. The silicon oxide film 20B as the intermediate layer is entirely etched after the baking treatment and left in the stepped configuration, in particular, only in the recessed portion at the surface of the silicon oxide film 20A as the lower layer (basically, the silicon oxide film 20B as the intermediate layer is not present to the inner wall of the connection hole 20D formed in the interlayer insulation film 20). The silicon oxide film 20B as the intermediate layer is coated to a film thickness, for example, of about 200 to 300 nm and applied with etching corresponding to the film thickness for example of a about 300 to 400 nm over the entire surface.

For the silicon oxide film 20C as the upper layer, a film deposited by a plasma CVD process using, for example, a TEOS gas as the main component of a source gas is used in the same manner as the silicon oxide film 20A as the lower layer. The silicon oxide film 20C as the upper layer is formed to a film thickness, for example, of about 300 to 500 nm.

The shunt word line 21 is formed in the step for forming a sixth level of conductor layer in the production process and it is constituted, for example, with a 3-layered structure in which a TiW film 21A as a lower layer, an aluminum alloy film 21B as an intermediate layer and a TiW film 21C as an upper layer are successively stacked respectively.

The TiW film 21A as the lower layer is formed mainly for improving the adhesion with the wiring (18) in the lower layer, improving the electromigration resistance, improving the stress migration resistance or the like. The TiW film 21A as the lower layer is deposited, for example, by sputtering and formed to a thickness of about 100 to 200 nm.

The aluminum alloy film 21B as the intermediate layer is formed as a main part of the wiring and mainly comprises aluminum of low resistance value. To the aluminum alloy film 21B as the intermediate layer, there are added about 0.5% of Cu with an aim of improving the electromigration and about 1% of Si mainly for reducing mutual diffusion between aluminum particles and silicon particles. The aluminum alloy film 21B as the intermediate layer is deposited, for example, by sputtering and formed to a film thickness of about 700 to 900 nm. Further, the aluminum alloy film 21B as the intermediate layer may be formed as a film to which either one of Cu or Si is added or may be formed as an aluminum film to which none of them is added.

The TiW film 21C as the upper layer is formed mainly for preventing aluminum hillrock caused to the surface of the aluminum alloy film 21B as the underlying intermediate layer, reducing the reflectance at the surface of the aluminum alloy film 21B as the intermediate layer or the like. The TiW film 21C as the upper layer is deposited, for example, by sputtering and formed to a thickness of about 120 to 280 nm.

The shunt word line 21 is connected to the word line 7A as the lower layer in either of the region, that is, at the end of the memory cell array (memory cell mat) or between the memory cell arrays. Each of the shunt word line 21 and the word line 7A is connected by way of an intermediate conductor layer formed with the same conductor as the column select line 19 and an intermediate conductor layer formed with the same conductor layer as the complementary bit line 17.

A final protection film 22 is formed on the shunt word line 21. The final protection film 22 is constituted, for example, as a three-layered structure in which a silicon oxide film 22A as the lower layer, a silicon nitride film 22B as an intermediate layer and a resin film as an upper layer successively laminated respectively.

The silicon oxide film 22A as the lower layer is formed mainly for moderating the overhang shape of the silicon nitride film 22B as the intermediate layer and preventing the occurrence of cavity caused by the overhang shape. For the silicon oxide layer 22A as the lower layer, a film deposited by a plasma CVD process capable of forming at a low temperature and using a TEOS gas as the main component of the source gas is used since the aluminum alloy film 21B is used for the intermediate layer of the shunt word line 21 as the lower layer and a heat treatment at high temperature can not be used. The silicon oxide film 22A as the lower layer is formed to a film thickness, for example, of about 300 to 600 nm.

The silicon nitride film 22B as the intermediate layer is formed mainly for improving the moisture proofness, deposited by a plasma CVD process and is formed to a film thickness, for example, of about 1.0 to 1.5 μm.

Although not illustrated in FIG. 1, the resin film as the upper layer is formed with aim of preventing the α-ray soft error, for which a polyimide series resin film coated, for example, by a rotational coating method and cured is used. The polyimide type resin film is formed to a film thickness, for example, of about 8 to 12 μm.

The n-channel MISFET Qn of the complementary MISFET for each of the direct peripheral circuit and the indirect peripheral circuits is constituted, for example, as shown in FIG. 1 to a main surface of a p-type well region 2 in an active region defined and surrounded at the periphery thereof with a device isolation region. That is, the n-channel MISFET Qn mainly comprises a pair of n-type semiconductor region 9 and a pair of n+-type semiconductor regions 11 used as the channel forming region (p-type well region 2), the gate insulation film 6, the gate electrode 7, and a source region and a drain region.

The device isolation region mainly comprises a device isolation insulation film 3 and a p-type channel stopper region 4 formed at a main surface of the p-type well region 2 below the device isolation insulation film 3. The p-type channel stopper region 4 is constituted at a higher impurity concentration as compared with that in the p-type well region 2. In this example, the p-type channel stopper region 4 formed in each of the regions for the direct peripheral circuit and indirect peripheral circuit is formed independently, of the p-type semiconductor region 5 below the device isolation insulation film 3 in the region of the memory cell array (in a separate production step), it may be replaced with the p-type semiconductor region 5 in the region of the memory cell array. In this case, the p-type semiconductor region 5 is, preferably, not formed as a device isolation region for such a device as n-channel MISFET Qn for which increased operation speed is required.

The gate electrode 7 is formed with the same conductor layer as that for the gate electrode 7 of the memory cell selecting n-channel MISFET Qm described above.

In each of the source region and the drain region, the n-type semiconductor region 9 is formed on the side of the channel-forming region of the n+-type semiconductor region 11 at high impurity concentration to constitute a n-channel MISFET Qn of a LDD structure. The n+-type semiconductor region 11 at high impurity concentration is formed, for example, by using ion implantation and introducing As at an impurity concentration of about $10^{15}$–$10^{16}$ (atoms/cm$^2$) at an energy level of about 70 to 90 KeV. Before introducing As that forms the n+-type semiconductor region 11, the gate electrode 7, the insulation film 8 and the side wall spacer 10 are used as impurity introduction masks A wiring 19C is connected to the n+-type semiconductor region 11 for each of the source region and the drain region of the n-channel MISFET Qn. The wiring 19C is formed with the same conductor layer as that for the data line 19 and connected through the connection hole 18C formed in the interlayer insulation films 16 and 18 to the n+-type semiconductor region 11.

A wiring 21A is formed above the wiring 19C. The wiring 21A is formed with the same conductor layer as that for the shunt word line 21A and connected with the wiring 19C through a connection hole 20D formed in the interlayer insulation film 20.

Description will be made briefly to the method of producing the DRAM with reference to FIG. 6 through FIG. 15 (cross sectional views for a portion in each of the production steps.

At first, a p−-type semiconductor substrate 1 comprising single crystal silicon is prepared. The p−-type semiconductor substrate 1 is formed to have a resistors value of about 8 to 12 ohm/cm and a (100) crystal phase is used as a main surface (device forming surface).

Then, an n-type well region is formed to the main surface of the p−-type semiconductor substrate 1 in a region for forming a p-channel MISFET of a complementary MISFET (not illustrated) for each of a direct peripheral circuit and an indirect peripheral circuit (hereinafter simply referred to as the peripheral circuit). Subsequently, a p-type well region 2 is formed to the main surface of a p−-type semiconductor substrate 1 in the region for forming each of the n-channel MISFET of the complementary MISFET for the peripheral circuit and the memory cell array. Each of the n-type well region and the p-type well region 2 is formed, for example, by introducing an impurity by ion implantation utilizing the difference in the film thickness of the silicon oxide films, in which the p-type well region 2 is formed in self aligment to the n-well type well region.

Then, a device isolation insulation film 3 is formed to a main surface of an inactive region (device isolation region) of each of the n-well region and the p-type well region 2 as shown in FIG. 6. The device isolation insulation film 3 is formed with a silicon oxide film, for example, to a film thickness of about 400 to 500 nm.

Prior to the step for forming the device isolation insulation film 3, a p-type channel stopper region 4 is formed to a main surface of the p-type well region 2 below the device isolation insulation film 3 in the region for forming the peripheral circuit. In the p-type channel stopper region 4, the impurity concentration is set somewhat higher as compared with the p-type well region 2 and it is formed at an impurity concentration, for example, of about $10^{18}$–$10^{19}$ atoms/cm$^2$.

Then, as shown in FIG. 7, a p-type semiconductor region 5 is formed at the inside of the p-type well region 2 in the region for forming a memory cell array. The p-type semiconductor region 5 has a somewhat higer impurity concentration as compared with the p-type well region 2 and it is formed by introducing B at an impurity concentration, for example, of about $10^{12}$–$10^{13}$ atoms/cm$^2$ and introducing them at an energy level of about 120 to 140 KeV. The p-type semiconductor region 5 formed under the conditions is formed in contact with the bottom of the device isolation insulation film 3 below the device isolation insulation film 3, through which boron passes in the device isolation region. Further, the p-type semiconductor region 5 is formed in the region for forming the memory cell at a position from the main surface of the p-type well region 2 which is deeper than the p-type semiconductor region 5 below the device isolation insulation film 3 and formed as a potential barrier.

Then, in the region for forming each of the memory cell array and the peripheral circuit, an impurity for controlling the threshold voltage of the MISFET is introduced in the active region of the main surface of the p-type well region 2 and the main surface of the n-type well region in the region for forming each of the memory cell array and the peripheral circuit. Subsequently, a gate insulation film 6 is formed to the active region in the main surface of the p-type well region 2 and the main surface of the n-type well region in the region for forming each of the memory cell array and the peripheral circuit (refer to FIG. 8). The gate insulation film 6 is formed by using a silicon oxide film formed by thermal oxidation, to a film thickness of about 13 to 15 nm.

Then, a gate electrode 7 is formed on the gate insulation film 6 in the region for forming each of the memory cell array and the peripheral circuit, and an insulation film 8 is formed on the gate electrode 7 for coating the upper surface thereof. Each of the gate electrode 7 and the insulation film 8 is formed by at first depositing, for example, a polycrystalline silicon film by a step for forming a first level of conductor layer, then depositing, for example, a silicon oxide film on the polycrystalline silicon film and then patterning the polycrystalline silicon film and the silicon oxide film each by using an identical mask. For the patterning, anisotropic etching technology such as photolithography or RIE is used. For the polycrystalline silicon film and the polycrystalline silicon film formed subsequent to this step, an n-type impurity, for example, P is introduced at a high impurity concentration, for example, of about $10^{20}$–$10^{21}$ atoms/cm$^3$.

In the same production step as the step for forming the gate electrode 7, a word line 7A is formed in the inactive region (on the device isolation insulation film 3) of the memory cell array, as well as an insulation film 8 for covering the upper surface of the word line 7A is formed in the same production step as that for forming the insulation film 8.

Then, in the region for forming each of the memory cell array and the peripheral circuit (entire surface of the substrate), a p-type impurity is introduced with an aim for forming a LDD structure for the p-channel MISFET of the complementary MISFET for the peripheral circuit. The p-type impurity is introduced to the main surface of the p-type semiconductor region 5 in the memory cell array, to the main surface of the n-type well region in the region for forming the p-channel MISFET for the peripheral circuit and to the main surface of the p-type well-region 2 in the region for forming the n-channel MISFET, respectively. The p-type impurity is formed, for example, by introducing BF$_2$ at a impurity concentration of about $10^{12}$–$10^{13}$ atoms/cm$^2$ by ion implantation at an energy level of about 70 to 90 KeV. Upon introducing the p-type impurity, the gate electrode 7 and the insulation film 8 (or the photoresist film used upon patterning them) are used as the main constituent of the impurity introduction mask.

Then, an n-type impurity is introduced in the region for forming the memory cell array and the n-channel MISFET for the peripheral circuit with an aim for forming a LDD structure for each of the memory cell selecting n-channel MISFET and n-channel MISFET. The n-type impurity is introduced to the main surface of the p-type semiconductor region 5 in the memory cell array, and to the main surface of the p-type well region 2 in the region for forming the n-channel MISFET for the peripheral circuit, respectively. The n-type impurity is introduced under the conditions described above. Upon introducing the n-type impurity, the gate electrode 7, the insulation film 8 and the photoresist film for covering the region for forming the p-channel MISFET for the peripheral circuit is used as the main constituent for the impurity introduction mask.

In this way, the LDD structure is formed by previously introducing the p-type impurity constituting the LDD structure of the p-channel MISFET in the region for the memory cell selecting n-channel MISFET of the memory cell array, and the n-channel MISFET and p-channel MISFET regions for the peripheral circuit, subsequently, introducing the n-type impurity constituting the LDD structure to the region of the memory cell selecting n-channel MISFET and the n-channel MISFET (conduction type is inverted from p- to n-type in a portion). With such a constitution, since there is required only one step for forming an impurity introduction mask used upon introducing the impurity into the region for each of the memory cell selecting n-channel MISFET, the n-channel MISFET of the complementary MISFET and the p-channel MISFET respectively, thereby enabling to reduce the number of steps in the production process of DRAM.

The p-type semiconductor region constituting the LDD structure of the p-channel MISFET for the peripheral circuit is formed by the introduction of the p-type impurity, and the n-type semiconductor region 9 constituting the LDD structure for each of the memory cell selecting n-channel MISFET and the n-channel MISFET for the peripheral circuit is formed by the introduction of the n-type impurity. Since the n$^+$-type semiconductor region 11 at high impurity concentration of the n-channel MISFET is not formed in the memory cell array, the memory cell selecting n-channel MISFET Qm is substantially completed by the step for forming the n-type semiconductor region 9 (refer to FIG. 8).

Then, a side wall spacer 10 is formed on the side of the gate electrode 7 (including the word line 7A) and the insulation film 8 for each of the memory cell selecting n-channel MISFET Qm and the n-channel MISFET and the p-channel MISFET for the peripheral circuit. The side wall spacer 10 can be formed by depositing a silicon oxide film to the entire surface of the substrate under the conditions described above and applying anisotropic etching such as RIE to the silicon oxide film by so much as the thickness of the deposited film. The side wall spacer 10 is formed in self alignment to the gate electrode 7 (and the word line 7A). Further, by the step of forming the side wall spacer 10, an insulation film that covers all the surface of the gate electrode 7 and the word line 7A (upper surface and the side) together with the previously formed insulation film 8 (covering the upper surface for each of the gate electrode 7 and the word line 7A) is completed.

Then, as shown in FIG. 8, an n$^+$-type semiconductor region 11 used either as a source region or as a drain region is formed to main surface of the p-type well region 2, in the region for forming the n-channel MISFET for the peripheral circuit. The n$^+$-type semiconductor region 11 is formed under the conditions described above. Upon introducing As, the gate electrode 7, the insulation film 8 as the upper layer thereof and the photoresist, the side wall spacer 10 and the photoresist film for covering the region for forming each of the memory cell array, the p-channel MISFET for the peripheral circuit is used as the main constituent of an impurity introduction mask. The n-channel MISFET Qn for the peripheral circuit is completed by the step for forming the n$^+$-type semiconductor region 11.

Then, an interlayer insulation film 12 is formed over the entire surface of the substrate including the region for forming each of the memory cell array and the peripheral circuit. The interlayer insulation film 12 is formed with an aim for forming a connection hole 12A for connecting a portion between the other of the n-type semiconductor regions 9 of the memory cell selecting n-channel MISFET Qm and the under layer electrode 13 of the information storage capacitance device. Further, the interlayer insulation film 12 is formed with an aim for providing insulation between the gate electrode 7 of the memory cell selecting n-channel MISFET Qm (and the word line 7A) and the lower layer electrode 13 of the information storage capacitance device. Further, the interlayer insulation film 12 is used also as an etching stopper layer upon patterning each of the dielectric film 14 and the upper layer electrode 15 of the information storage capacitance device.

The interlayer insulation film 12 is formed, for example, with a silicon oxide film deposited by a low-pressure CVD process using $SiH_4$ as a source gas and formed to a thickness of about 150 to 250 nm.

Then, in the region for forming the memory cell array, a portion of the interlayer insulation film 12 on the other of the n-type semiconductor regions 9 of the memory cell selecting n-channel MISFET Qm is removed to form a connection hole 12A at which the surface of the other of the semiconductor regions 9 is exposed. The connection hole 12A is formed by aligning the opening end on the gate electrode 7 of the memory cell selecting n-channel MISFET Qm and on the word line 7A connected with the adjacent memory cell.

Then, as shown in FIG. 9, a lower layer electrode 13 to be connected with the other of the n-type semiconductor regions 9 of the memory cell selecting n-channel MISFET Qm through the connection hole 12A formed in the interlayer insulation film 12 is formed in the region for forming the memory cell array on the interlayer insulation film 12. The lower layer electrode 13 is formed under the conditions described above in the step for forming a second level of conductor layer.

Figure 10:
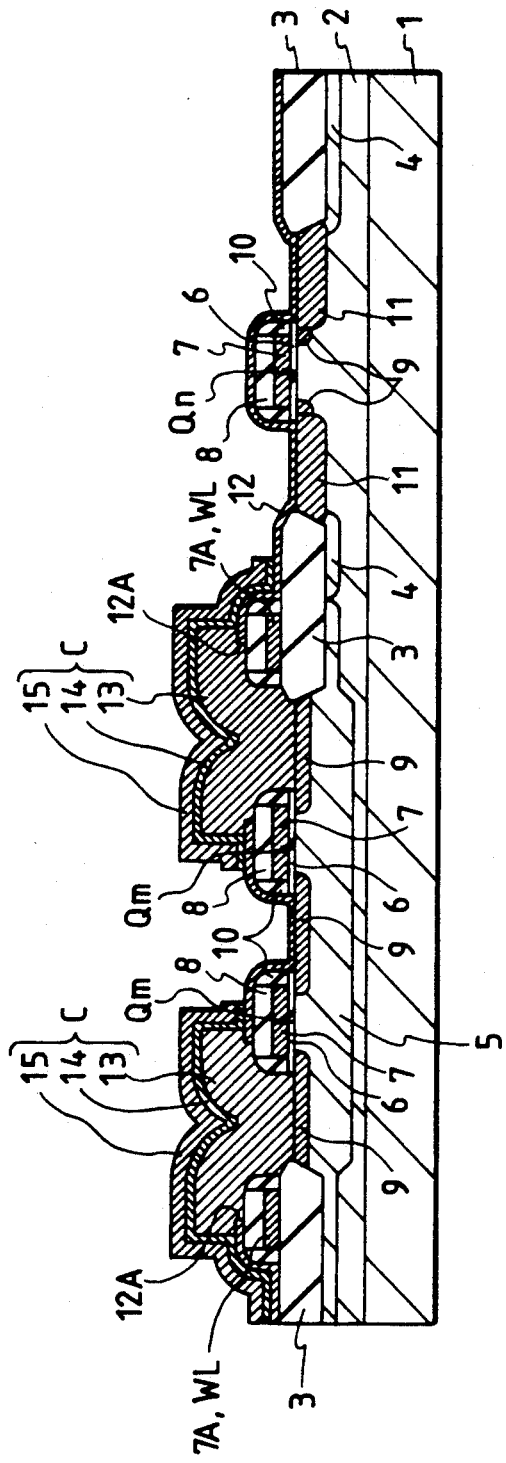

Then, as shown in FIG. 10, a dielectric film 14 is formed along the upper surface and the side of the lower layer electrode 13 over the entire surface of the substrate including the region for forming memory cell array and an upper layer electrode 15 is formed on the dielectric film 14. The dielectric layer 14 is patterned by using the upper layer electrode 15 as an upper layer thereof as an etching mask. The upper layer electrode 15 is formed under the conditions described above in the step for forming a third level of conductor layer.

An information storage capacitance device C of the stacked structure is completed by the step for forming the upper layer electrode 15, and the memory cell M is completed by the completion of the information storage capacitance device C.

Then, a p+-type semiconductor region used either as a source region or as a drain region is formed to the main surface of the n-type well region in the region for forming the p-channel MISFET for the peripheral circuit although not illustrated. The p+-type semiconductor region is formed, for example, by introducing $BF_2$ at an impurity concentration of about $10^{15}$–$10^{16}$ atoms/cm$^2$ by ion implantation at an energy level of about 70 to 90 KeV. Upon introducing $BF_2$, a photoresist film for covering the gate electrode 7, the insulation layer 8 as the upper layer thereof, the side wall spacer 10 and the region for forming each of the memory cell array and the n-channel MISFET for the peripheral circuit is used as the main constituent of an impurity introduction mask. The p-channel MISFET for the peripheral circuit is completed by the step for forming the p+-type semiconductor region, and the complementary MISFET is completed in the peripheral circuit.

Figure 11:
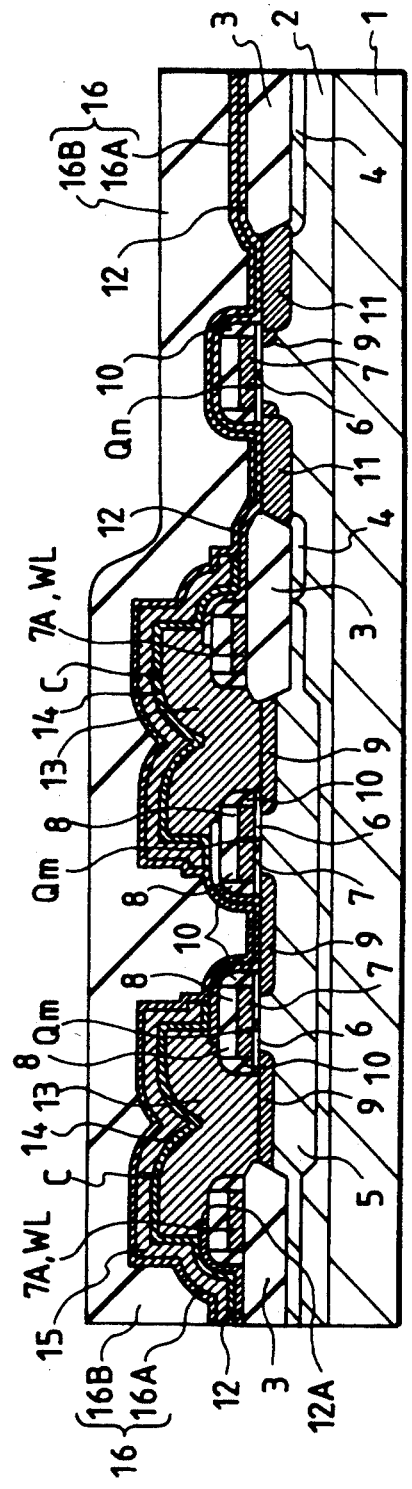

Then, as shown in FIG. 11, an interlayer insulation film 16 is formed over the entire surface of the substrate including the region for forming the memory cell array. The interlayer insulation film 16 is formed by successively stacking each of the silicon oxide film 16A as the lower layer and the BPSG film 16B as the upper layer formed successively under the conditions as described above. The BPSG film 16B as the upper layer is applied with reflow after the deposition thereof to flatten the surface.

Figure 16:
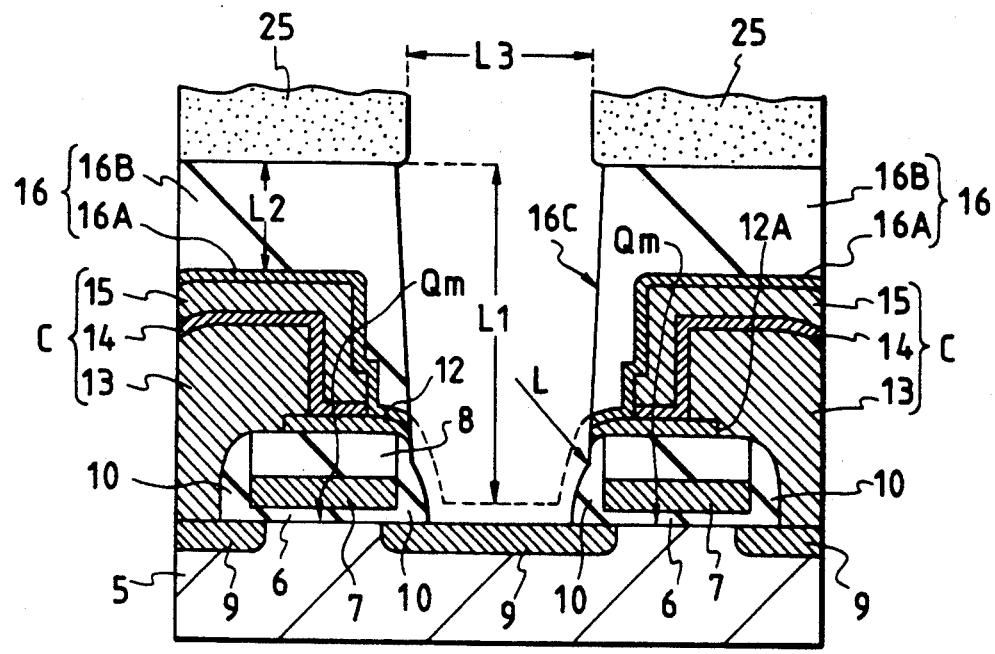
FIG. 16 is a cross sectional view of a memory cell portion in a certain production step.

As shown in FIG. 11 and, particularly, in FIG. 16 (an enlarged cross sectional view for a portion), when reflow is applied to the BPSG film 16B as the upper layer of the interlayer insulation film 16, the film thickness L1 of the BPSG film 16B as the upper layer on one of the n-type semiconductor regions 9 of the memory cell selecting n-channel MISFET Qm is made greater as compared with the film thickness L2 on the information storage capacitance device C by so much as the film thickness for the sum of the gate electrode 7, the insulation film 8, the lower layer electrode 13 and the upper layer electrode 15. In other words, the BPSG film 16 as the upper layer can flatten the surface by filling a recessed shape in the region of one of the n-type semiconductor regions 9 of the memory cell selecting n-channel MISFET Qm.

Then, as shown in FIG. 12 and FIG. 16, a connection hole 16C is formed to the interlayer insulation film 16 in the region for forming the memory cell array to expose the surface of one of the n-type semiconductor regions 9 of the memory cell selecting n-channel MISFET Qm. The connection hole 16C is formed by using a photoresist film formed by photolithography as an etching mask 25, and by anisotropic etching using a mixed etching gas of fluoro compounds, that is, $CF_4$ and $CHF_3$ together with Ar sputtering. The opening in the etching mask 25 has a pattern of exposing the surface of one of the n-type semiconductor regions 9 of the memory cell selecting n-channel MISFET Qm within a range defined at the periphery thereof with the side wall spacer 10 from the inside of the connection hole 16C and setting the inner wall of the connection hole 16C on the side wall spacer 10.

In the connection hole 16C formed under such conditions, as shown in FIG. 16, the BPSG film 16B as the upper layer of the interlayer insulation film 16 is at first etched and, when the etching proceeds to expose the surface of the side wall spacer 10, the BPSG film 16B as the upper layer is completely etched while the surface of the side wall spacer 10 is slightly etched (before expose of the surface of the gate electrode 7) since the etching rate for the side wall spacer 10 is low. That is, even when mask misalignment should be caused in view of the production process between the gate electrode 7 of the memory cell selecting n-channel MISFET Qm and the opening of the etching mask 25, the connection hole 16C is formed in self alignment to the gate electrode 7 since the position for the surface of one of the n-type semiconductor regions 9 (connection region with the complementary bit line 17) is defined with the side wall spacer 10.

As shown in FIG. 16, the film thickness L of the side wall spacer 10 becomes thinnest, to the retraction of the wall thickness, at the upper corner of the gate electrode 7 exposed from the inner wall in the connection hole 16C due to make the insulation withstand voltage most weak (electric field is concentrated). In this example, however, since the side wall spacer 10 is formed under the condition that the film thickness L is 50 nm or greater, and etching for forming the connection hole 16C is conducted, a sufficient insulation withstand voltage can be ensured.

Further, as shown in FIG. 16, the connection hole 16C has a small opening diameter L3 relative to its depth (corresponding to the sum of the film thickness of the interlayer insulation film 12, the film thickness of the silicon oxide film 16A as the lower layer of the interlayer insulation film 16 and the film thickness L1 for the BPSG film 16B as the upper layer) and the aspect ratio (a value obtained by dividing the depth by the opening diameter) thereof is set to about 1–3.

Then, after removing the etching mask 25, as shown in FIG. 13, a complementary bit line 17 connected with the memory cell M through the connection hole 16C is formed in a region for forming the memory cell array on the interlayer insulation film 16. The complementary bit line 17 is formed under the conditions described above in the step for forming a fourth level of conductor layer.

Then, an interlayer insulation film 18 is formed over the entire surface of the substrate including the region for forming the memory cell array and, subsequently, a connection hole 18C is formed to the interlayer insulation film 18. Since the connection hole 18C is formed also in the connection portion of the gate electrode 7 with the upper layer wiring in the region for forming each of the n-channel MISFET Qn and the p-channel MISFET for the peripheral circuit (since connection with the wiring 19C can not be made if the connection hole 18C is not formed), it is formed mainly on each of the n+-type semiconductor region 11 and the p+-type semiconductor region not setting the inner wall on the insulation film 8 at the upper surface and on the side wall spacer 10 of the gate electrode 7, different from the case of the connection hole 16C described above. In a case where the connection hole 18C is formed, for example, in separate steps on each of the connection portion of the gate electrode 7 of the n-channel MISFET Qn for the peripheral circuit with the upper layer wiring and the n+-type semiconductor region 11 as the source region or the drain region, the inner wall of the connection hole 18C on the n+-type semiconductor region 11 can be set on the side wall spacer 10 or on the gate electrode 7, like that the connection hole 16C.

Figure 14:
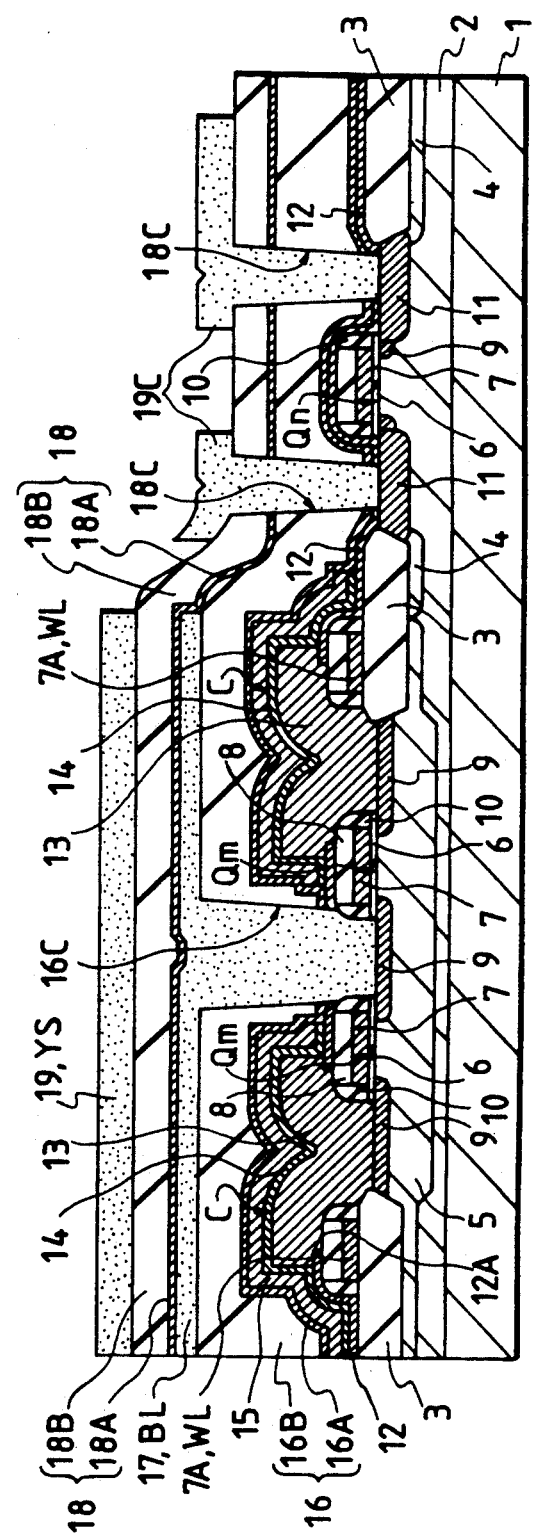

Then, as shown in FIG. 14, a column select line 19 is formed in the region for forming the memory cell array on the interlayer insulation film 18, as well as a wiring 19A is formed in the region for forming the peripheral circuit on the interlayer insulation film 18. The column select line 19 and the wiring 19A are formed under the conditions as described above in the step for forming a fifth level of conductor layer.

Figure 15:
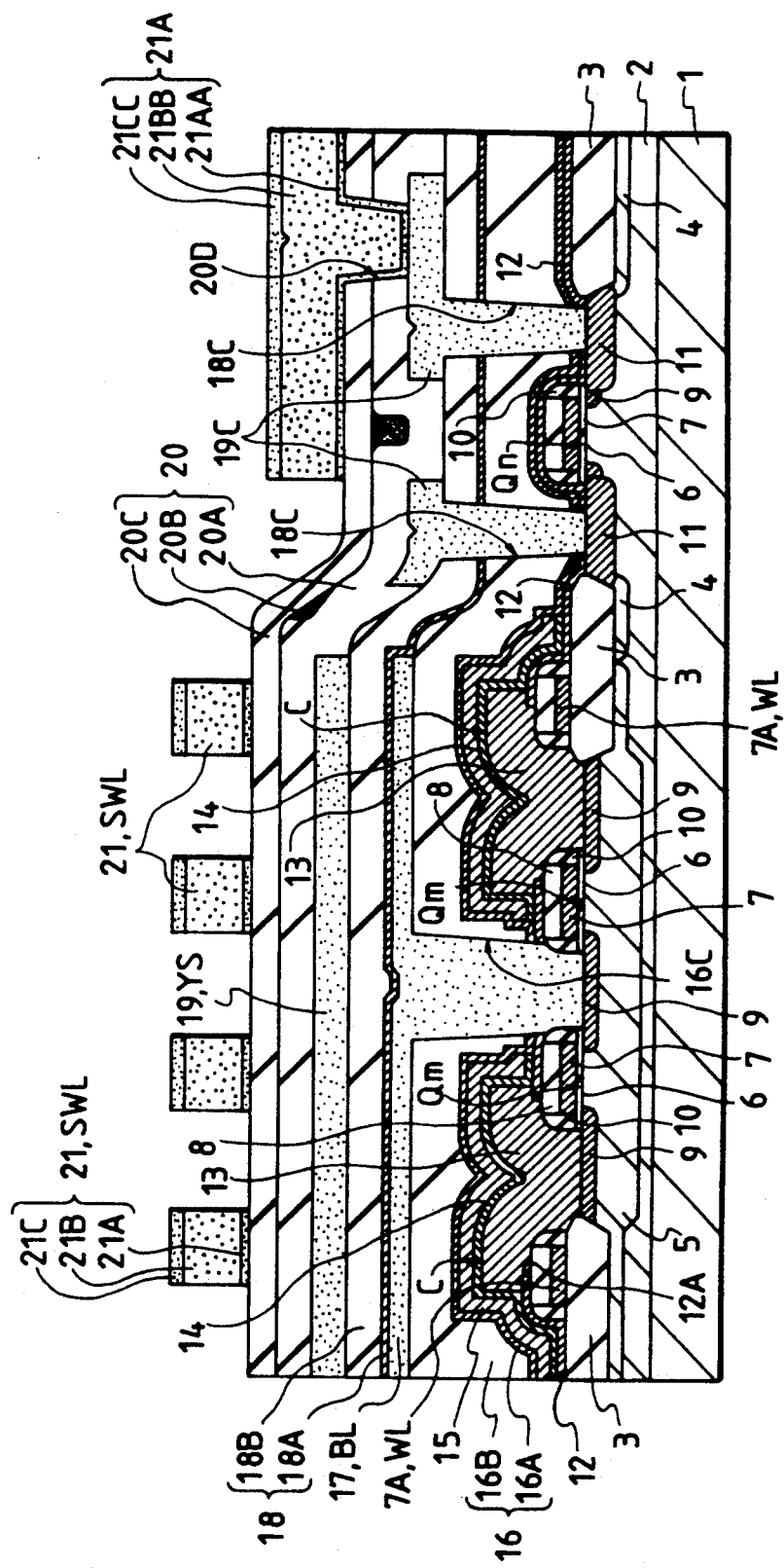

Then, each of an interlayer insulation film 20 and a connection hole 20D is formed over the entire surface of the substrate including the region for forming the memory cell array and, as shown in FIG. 15, a shunt word line 21 is formed in the region for forming the memory cell array, as well as the wiring 21 is formed in the region for the peripheral circuit. The shunt word line 21 and the wiring 21A are formed under the conditions described above in the step for forming a sixth level of conductor layer.

Then, a final protection film 22 is formed over the entire surface of the substrate including the region for forming the memory cell array, thereby completing DRAM shown in FIGS. 1 and 2 described above.

In this way, a method of producing a DRAM in which a memory cell M is constituted with a serial circuit of a memory cell selecting n-channel MISFET Qm and an information storage capacitance device C comprises:

a step of forming a memory cell selecting n-channel MISFET Qm having each of a gate electrode 7 formed by way of a gate insulation film 6 on a main surface of a p-type semiconductor region 5 (p⁻-type semiconductor substrate 1) and an n-type semiconductor region 9 used as a source region or a drain region formed on the main surface of the p-type semiconductor region 5 on the side of the gate electrode 7, a step of forming a side wall spacer for covering the side of the gate electrode 7 of the memory cell selecting n-channel MISFET Qm, a step of forming an interlayer insulation film 16 (at least a BPSG film 16B as the upper layer) having a large thickness on the n-type semiconductor region 9 as compared with that on the gate electrode 7 and having a higher etching rate as compared with that of the side wall spacer 10 on each of the gate electrode 7 and the n-type semiconductor region 9 of the memory cell selecting n-channel MISFET Qm by way of at least the side wall spacer 10, a step of applying etching to the interlayer insulation film 16 on the n-type semiconductor region 9 and the side wall spacer 10 of the memory cell selecting n-channel MISFET Qm under the conditions that the etching rate for the interlayer insulation film 16 is higher as compared with that for the side wall spacer 10 and the surface of the n-type semiconductor region 9 is exposed without exposing the surface of the gate electrode 7, thereby forming a connection hole 16C, and a step of forming a complementary bit line 17 to be connected with the exposed surface of the n-type semiconductor region 9 of the memory cell selecting n-channel MISFET Qm through the connection hole 16C on the interlayer insulation film 16.

With such a constitution, the following advantageous effects (A) through (C) can be obtained.

(A) Since the etching rate for the interlayer insulation film 16 formed on the side wall spacer 10 formed on the side of the gate electrode 7 of the memory cell selecting n-channel MISFET Qm is made higher than that for the side wall spacer 10 and the etching amount for the side wall spacer 10 upon etching the interlayer insulation film 16 thereby forming the connection hole 16C is small, the surface of the gate electrode 7 is always covered with the side wall spacer 10 at the inner wall of the connection hole 16, and the film thickness of the side wall spacer 10 can be ensured reliably. As a result, an insulation withstand voltage can be kept between a portion in the connection hole 16C for the complementary bit line 17 and the gate electrode 7 of the memory cell selecting n-channel MISFET Qm can be ensured to prevent short circuit between both of them.

(B) Since the interlayer insulation film 16 is formed with a greater thickness on the n-type semiconductor region 9 as compared with that on the gate electrode 7 of the memory cell selecting n-channel MISFET Qm, the surface of the interlayer insulation film 16 can be flattened. The flattening for the surface of the interlayer insulation film 16 can improve the fabrication accuracy for the complementary bit line 17 or the wiring as the upper layer thereof, as well as residue in the stepped region of the mask formed by photolithography can be eliminated in the step of patterning the complementary bit line 17 or the upper wiring layer thereof to prevent short circuit between adjacent wirings.

(C) Since the inner wall of the connection hole 16C is formed along the surface of the side wall spacer 10 formed to the side wall of the gate electrode 7 of the memory selecting n-channel MISFET Qm, and an isolation distance at least between the side of the gate electrode 7 and the inner wall of the connection hole 16C is substantially defined with the film thickness of the side wall spacer 16, the connection hole 16C is formed in self-alignment to the gate electrode 7, and the connection position between the surface of n-type semiconductor region 9 and the complementary bit line 17 is formed in self alignment to the gate electrode 7. As a result, since the dimensional margin for mask alignment in view of the production process of DRAM can be saved between the electrode 7 of the memory cell selecting n-channel MISFET Qm and the connection position (bit line contact region), it is possible to reduce area the occupied by the memory cell M by so much as the dimensional margin of the mask alignment, to improve the degree of integration for the DRAM.

Further, the step of forming the side wall spacer 10 for covering the side of the gate electrode 7 is a step of forming the silicon oxide film deposited by a CVD process, and the step for forming the interlayer insulation film 16 is a step of depositing the BPSG film 16B, and the step of forming the connection hole 16C is a step of etching a region as a portion of the interlayer insulation film 16C by anisotropic etching comprising a fuloro compound as a main component of the etching gas. With such a constitution, since the BPSG film 16B of the interlayer insulation film 16 is liable to emit fluorine radicals due to the fluorine compound for anisotropic etching used upon forming the connection hole 16C, and the etching rate can be increased, the etching rate for the BPSG film 16B can be increased as compared with that of the deposited silicon oxide film as the side wall spacer 10.

Further, the step of forming the interlayer insulation film 16 is a step of depositing the BPSG film 16B, subsequently, applying reflow to the BPSG film 16B, thereby flattening the surface of the BPSG film 16B and the step of forming a connection hole 16C through the interlayer insulation film 16 is a step conducted after applying reflow to the BPSG film 16B as the interlayer insulation film 16. With such a constitution, since the connection hole 16C is formed after applying reflow to the BPSG film 16B as the interlayer insulation film 16, even when the aspect ratio obtained by dividing the depth of the connection hole 16C with the opening diameter of the connection hole 16 is increased, there is no worry that the BPSG film 16B flows into the connection hole 16C due to reflow and fills the inside of the connection hole 15C.

Further, the step of forming the connection hole 16C is a step conducted while ensuring the size of at least 50 nm for the minimum thickness L of the side wall spacer 10 at a portion from a corner between the upper surface and the side of the gate electrode 7 to the inner wall of the connection hole 16C. This constitution can ensure an insulation withstand voltage between the gate electrode 7 and the complementary bit line 17 formed in the connection hole 16C.

Further, in the present invention, the insulation film 8 or the side wall spacer 10 on the gate electrode 7 of the memory cell selecting n-channel MISFET Qm of the memory cell M of the DRAM may be formed with a silicon oxide film deposited by an atmospheric CVD process using an organic silane gas as a main component of a source gas or a silicon nitride film deposited by a CVD process.

Further, in the present invention, the interlayer insulation film 16 as the underlying layer for the complementary bit line 17 of the DRAM may be constituted mainly with a PSG film applied with reflow. Further, in the present invention, the interlayer insulation film 16 may be formed mainly with a silicon oxide film coated by a rotational coating method and cured by a baking treatment (a structure similar to that of the interlayer insulation film 20), mainly with an organic resin film or mainly with a silicon oxide film deposited by a CVD process (not applied with reflow) under a condition of flattening the surface.

For instance, in a case of combination with the interlayer insulation film 16 and the side wall spacer 10 shown below on the left, an etching selection ratio shown below on the right is obtained by applying anisotropic etching using a mixed etching gas comprising $CF_4$ and $CFH_3$ together with Ar sputtering.

(A) BPSG: silicon nitride film: 4:1–6:1
(B) Silicon oxide film coated by SOG method: silicon oxide film deposited by low-pressure CVD process using inorganic silane gas as a source gas: 3:1–10:1.

Further, in a case of combination with the interlayer insulation film 16 and the side wall spacer 10 shown below on the left, an etching selection ratio shown below on the right can be obtained by oxygen plasma etching.

Polyimide type resin film: silicon oxide film deposited by an atmospheric pressure CVD process using an organic silane gas as a source gas greater than 100:1.

EMBODIMENT 2

This is a second embodiment of the present invention in which a connection hole for a wiring to be connected with the source region or the drain region of MISFET is aligned on the gate electrode.

Figure 17:
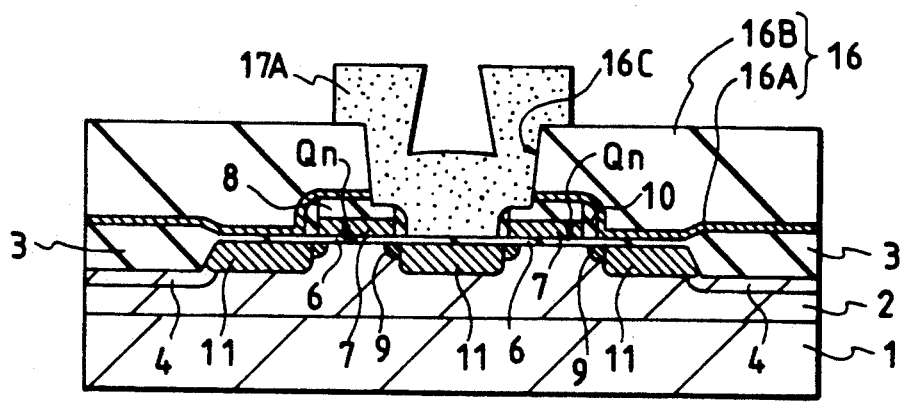
FIG. 17 is a cross sectional view of a semiconductor integrated circuit device as an Embodiment 2 of the present invention.

FIG. 17 (cross sectional view for a portion) shows a constitution of a semiconductor integrated device having MISFET as Embodiment 2 of the present invention.

An n-channel MISFET Qn shown in FIG. 17 constitutes a portion of a complementary MISFET for a peripheral circuit of DRAM in Embodiment 1 described above or a logic circuit of a logic LSI or a microprocessor. In the n-channel MISFET Qn, a wiring 17A is connected with a $n^+$-type semiconductor region 11 used as a source region or a drain region through a connection hole 16C formed in an interlayer insulation film 16.

The interlayer insulation film 16 is formed with a stacked film comprising a silicon oxide film 16A as a lower layer and a BPSG film (or PSG film) 16B in the same manner as in Embodiment 1 described above. The connection hole 16C is stacked positioned and aligned with the inner wall thereof being situated on the gate electrode 7, that is, on the insulation film 8 covering the upper surface of the gate electrode 7 of the n-channel MISFET Qn. The wiring 17A is formed with the same film as the complementary bit line 17 in the case of a DRAM or formed, for example, with an aluminum alloy film in a case of a logic LSI. In the same manner as Embodiment 1 described above, a connection region between the $n^+$-type semiconductor region 11 of the n-channel MISFET Qn and the wiring 17A is formed in self alignment to the gate electrode 7.

The gate electrode 7 of the n-channel MISFET Qn is previously coated at the upper surface thereof with the insulation film 8 and then covered at the side thereof with the side wall spacer 10 in separate production steps, and it is regarded that the insulation film covering the surface of the gate electrode 7 is completed at a stage where the upper surface and the side are completely covered, that is, the side wall spacer 10 is formed.

According to Embodiment 2, the same advantageous effects as those in Embodiment 1 can be provided.

Although the present invention made by the present inventor has been described concretely with reference to the Embodiments, the present invention is not limited to the Embodiments but it may, of course, be modified in various ways within a scope not departing the gist of the invention.

For instance, the present invention is not restricted to the semiconductor integrated circuit device but it is also applicable to a wiring substrate having a multi-layered wiring structure. In this case, in the present invention, a connection hole for connecting a first layer wiring and a third layer wiring as an upper layer thereof is formed in self alignment to a second layer wiring between the first layer wiring and the third layer wiring.

Advantageous effects obtained by typical examples of the present invention disclosed herein are simply explained as below.

In the wiring technique of a semiconductor integrated circuit device for connecting an upper conductor layer to a lower conductor layer, it is possible insulation withstand voltage can be improved between an upper conductor layer and an intermediate conductor layer that situate between the upper conductor layer and the lower conductor layer, the surface of the underlying insulation layer for the upper conductor layer can be flattened, and a connection region between the lower conductor layer and the upper conductor layer can be formed in self alignment to the intermediate conductor layer.

In a semiconductor integrated circuit device for connecting a wiring to one of semiconductor regions of MISFET, an insulation withstand voltage can be improved between the gate electrode of the MISFET and the wiring, the surface of the underlying insulation layer for the wiring can be flattened and a connection region between one of the semiconductor regions and the wiring can be formed in self alignment to the gate electrode of the MISFET.

What is claimed is:

1. A method of producing a semiconductor integrated circuit device, comprising:
   (a) a step of preparing a semiconductor substrate having a first semiconductor region of a first conduction type and a first insulation film and a second insulation film on a main surface thereof, in which said first insulation film is situated on said first semiconductor region and said second insulation film has a thickness greater than said first insulation film and is situated so as to surround said first insulation film;
   (b) a step of forming a first conductor layer and a second conductor layer each having both ends on said first insulation film and a third insulation film and a fourth insulation film on said first conductor layer and said second conductor layer, in which said first conductor layer has an identical pattern with that of said third insulation film and said second conductor layer has an identical pattern with that of said fourth insulation film respectively, in a planar view;
   (c) a step of introducing a first impurity of a second conduction type to the surface of said first semiconductor region for forming a second semiconductor region, in which said first impurity is introduced in self-alignment to said second insulation film and said first and second conductor layers;
   (d) a step of forming a fifth insulation film on said semiconductor substrate, subsequently, applying a reactive-ion etching to said fifth insulation film thereby selectively leaving said fifth insulation film at both ends of said first and second conductor layers;
   (e) a step of forming a sixth insulation film on said semiconductor substrate and applying a heat treatment to said sixth insulation film thereby flattening the surface thereof;
   (f) a step of forming a hole in said sixth insulation film and exposing a portion of a second semiconductor region situated between said first and second conductor layers and a portion of said fifth insulation film; and
   (g) a step of forming a third conductor layer on a portion of said second semiconductor region exposed in the step (f) and on said sixth insulation film.

2. A method of producing a semiconductor integrated circuit device according to claim 1, wherein the sixth insulation film comprises an impurity of boron and phosphorus, and the fifth insulation film is an oxide film formed by CVD.

3. A method of producing a semiconductor integrated circuit device according to claim 2, wherein the concentration of boron is 12 to 14 mol % and the concentration of phosphorus is 5 to 7 mol %.

4. A method of producing a semiconductor integrated circuit device according to claim 3, wherein the heat treatment is applied at 850° to 950° C.

5. A method of producing a semiconductor integrated circuit device according to claim 3, wherein the hole is formed by dry etching using a gas mixture of $CF_4$ and $CHF_3$.

6. A method of producing a semiconductor integrated circuit device having word lines extending in row direction, data lines extending in column direction and a plurality of memory cells arranged in rows and columns and connected to each of the word line and the data line, comprising the steps of:
   (a) a step of preparing a semiconductor substrate having a first semiconductor region of a first conduction type and a first insulation film and a second insulation film on a main surface thereof, in which said first insulation film is situated on said first semiconductor region and said second insulation film has a thickness greater than said first insulation film and is situated so as to surround said first insulation film;
   (b) a step of forming a first conductor layer on said first insulation film and a third insulation film on said first conductor layer;
   (c) a step of selectively eliminating said first conductor layer and third insulation film and forming first and second word lines on said first semiconductor region, in which said first and second word lines are extended in row direction and have both ends in column direction, respectively;

(d) a step of introducing a first impurity of a second conduction type for forming a second semiconductor region to the surface of said first semiconductor region, in which said first impurity is introduced in self-alignment to said first and second word lines and said second insulation film;

(e) a step of forming a fourth insulation film on said semiconductor substrate, subsequently, applying a reactive-ion etching to said fourth insulation film thereby selectively leaving said fourth insulation film at both ends of said first and second word lines;

(f) a step of forming a capacitance device comprising a first electrode, a second electrode and a dielectric film situated therebetween, in which said capacitance device is electrically connected with a second semiconductor region situated between said first word line and said second insulation film;

(g) a step of forming a fifth insulation film on said semiconductor substrate and applying a heat treatment to said fifth insulation film thereby flattening the surface thereof;

(h) a step of forming a hole in said fifth insulation film and exposing a portion of a second semiconductor region situated between said first and second word lines and a portion of said fourth insulation film; and (i) a step of forming a second conductor layer as said data line on a portion of said second semiconductor region exposed in the step (h) and on said fifth insulation film.

7. A method of producing a semiconductor integrated circuit device according to claim 6, wherein the fifth insulation film comprises an impurity of boron and phosphorus, and the fourth insulation film is an oxide film formed by CVD.

8. A method of producing a semiconductor integrated circuit device according to claim 7, wherein the concentration of boron is 12 to 14 mol % and the concentration of phosphorus is 5 to 7 mol %.

9. A method of producing a semiconductor integrated circuit device according to claim 8, wherein the heat treatment is applied at 850° to 950° C.

10. A method of producing a semiconductor integrated circuit device according to claim 8, wherein the hole is formed by dry etching using a gas mixture of $CF_4$ and $CHF_3$.

11. A method of producing a semiconductor integrated circuit device according to claim 6, wherein the first and second electrodes comprise polysilicon.

12. A method of producing a semiconductor integrated circuit device according to claim 11, wherein the first and the second insulation film comprise silicon oxide films.

13. A method of producing a semiconductor integrated circuit device according to claim 12, wherein the third insulation film is a silicon oxide film formed by a CVD process.

14. A method of producing a semiconductor integrated circuit device according to claim 13, wherein the word line comprises a polysilicon layer.

15. A method of producing a semiconductor integrated circuit device according to claim 14, wherein the data line has a stacked structure comprising a polysilicon layer and a high melting metal silicide layer disposed thereover.

* * * * *